(12) United States Patent
Oh

(10) Patent No.: US 11,754,718 B2
(45) Date of Patent: Sep. 12, 2023

(54) TIME OF FLIGHT IMAGING USING LONG AND SHORT-EXPOSURE STORAGE NODES

(71) Applicant: Microsoft Technology Licensing, LLC, Redmond, WA (US)

(72) Inventor: Minseok Oh, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 438 days.

(21) Appl. No.: 16/943,978

(22) Filed: Jul. 30, 2020

(65) Prior Publication Data
US 2022/0035038 A1 Feb. 3, 2022

(51) Int. Cl.
| | | |
|---|---|---|
| *H04N 5/369* | (2011.01) | |
| *H01L 27/146* | (2006.01) | |
| *G01S 17/894* | (2020.01) | |
| *G01S 17/36* | (2006.01) | |
| *H04N 25/59* | (2023.01) | |
| *H04N 25/75* | (2023.01) | |

(52) U.S. Cl.
CPC ............ *G01S 17/894* (2020.01); *G01S 17/36* (2013.01); *H04N 25/59* (2023.01); *H04N 25/75* (2023.01)

(58) Field of Classification Search
None
See application file for complete search history.

(56) References Cited

U.S. PATENT DOCUMENTS

| | | | |
|---|---|---|---|
| 2006/0114333 A1 | 6/2006 | Gokturk et al. | |
| 2011/0164132 A1* | 7/2011 | Buettgen | G01S 17/36 |
| | | | 348/135 |
| 2018/0059224 A1 | 3/2018 | Wang et al. | |
| 2020/0314376 A1* | 10/2020 | Kim | G01S 17/894 |
| 2022/0035038 A1* | 2/2022 | Oh | H01L 27/14654 |

OTHER PUBLICATIONS

"International Search Report and Written Opinion Issued in PCT Application No. PCT/US21/030030", dated Aug. 17, 2021, 12 Pages.

* cited by examiner

*Primary Examiner* — Howard D Brown, Jr.
(74) *Attorney, Agent, or Firm* — Alleman Hall Creasman & Tuttle LLP

(57) ABSTRACT

Examples are disclosed that relate to time of flight imaging using long-exposure and short-exposure storage nodes for each pixel tap of a pixel in an image sensor. One example provides a time-of-flight camera, comprising an image sensor comprising a plurality of pixels, each pixel of the plurality of pixels comprising one or more taps, each tap comprising a photogate, a short-exposure storage node configured to receive charge during a short-exposure interval of an integration period, a long-exposure storage node configured to receive charge during a long-exposure interval of the integration period, a short-exposure switch gate configured to direct charge generated during the short-exposure interval to the short-exposure storage node, a long-exposure switch gate configured to direct charge generated during the long-exposure period to the long-exposure storage node, and a readout mechanism comprising one or more floating diffusion capacitors.

20 Claims, 19 Drawing Sheets

TIME OF FLIGHT IMAGING USING LONG AND SHORT-EXPOSURE STORAGE NODES

BACKGROUND

A time-of-flight (ToF) camera determines, at each pixel of the camera, a depth of a subject relative to the ToF camera based on the known speed of light and a measured time of flight of light between the ToF camera and the subject. For example, a light signal may be temporally modulated to illuminate the subject. The back-reflected light signal may be sensed by a sensor array of the ToF camera and evaluated to determine a phase difference, from which the depth may be calculated.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to time of flight imaging using long-exposure and short-exposure storage nodes for each pixel tap of a pixel in an image sensor. One example provides a time-of-flight camera, comprising an image sensor comprising a plurality of pixels, each pixel of the plurality of pixels comprising one or more taps, each tap comprising a photogate, a short-exposure storage node configured to receive charge during a short-exposure interval of an integration period, a long-exposure storage node configured to receive charge during a long-exposure interval of the integration period, a short-exposure switch gate configured to direct charge generated during the short-exposure interval to the short-exposure storage node, a long-exposure switch gate configured to direct charge generated during the long-exposure period to the long-exposure storage node, and a readout mechanism comprising one or more floating diffusion capacitors.

DETAILED DESCRIPTION

A time-of-flight (ToF) camera may determine, for each addressable pixel of an image sensor of the camera, a depth of a subject (a distance from the subject to the pixel) based on a phase of a received light signal that is temporally modulated by a ToF illuminator. The depth values determined for each addressable pixel of the camera image sensor are used to create a depth image, which may be used, for example, to identify motion (e.g. gestures) of a subject.

The received light signal generates photoelectrons in a region of the pixel, thereby producing an electric charge signal. A ToF sensor may modulate the pixel response in synchronization with a modulated illumination source to direct the charge to different taps of the pixel during an integration period. A global shutter mechanism may be used to simultaneously modulate the entire pixel array. Data is sampled at a plurality of different phases of the temporally modulated light signal, and a depth value for a pixel is determined using the signals acquired for each pixel tap at each illumination phase that is sampled.

In current ToF depth sensing systems, dynamic range may be limited by pixel storage node capacity. For example, pixels of the ToF camera imaging relatively closer objects can saturate, resulting in the signal at that pixel being clipped. On the other hand, if an amount of light entering the camera is reduced (e.g. by reducing an aperture size and/or exposure time) to avoid clipping in pixels that image objects closer to the camera, pixels that image objects farther from the camera may suffer from a poor signal-to-noise ratio due to ambient light, which can negatively impact a depth determination at that pixel.

Accordingly, examples are disclosed that relate to ToF image sensors that provide for a potentially higher dynamic range than conventional ToF image sensors. In the disclosed examples, a full well capacity of an image sensor pixel is extended by using a plurality of storage nodes per pixel tap, wherein each storage node is configured to integrate light for different amount of time during an integration period. In some examples, two storage nodes per tap may be used, which are referred to herein as a short-exposure storage node and a long-exposure storage node. The disclosed example pixels also include a short-exposure switch gate configured to direct charge to the short-exposure storage node, and a long-exposure switch gate configured to direct charge to the long-exposure storage node. In other examples, a pixel may have more than two storage nodes. The disclosed examples capture the long-exposure and the short-exposure time signals in a single frame, which may help to avoid motion artifacts that may arise when integrating short and long exposures for a pixel in sequential frames. The term "high dynamic range" (HDR) may be used herein to represent such pixel configurations.

Figure 1:
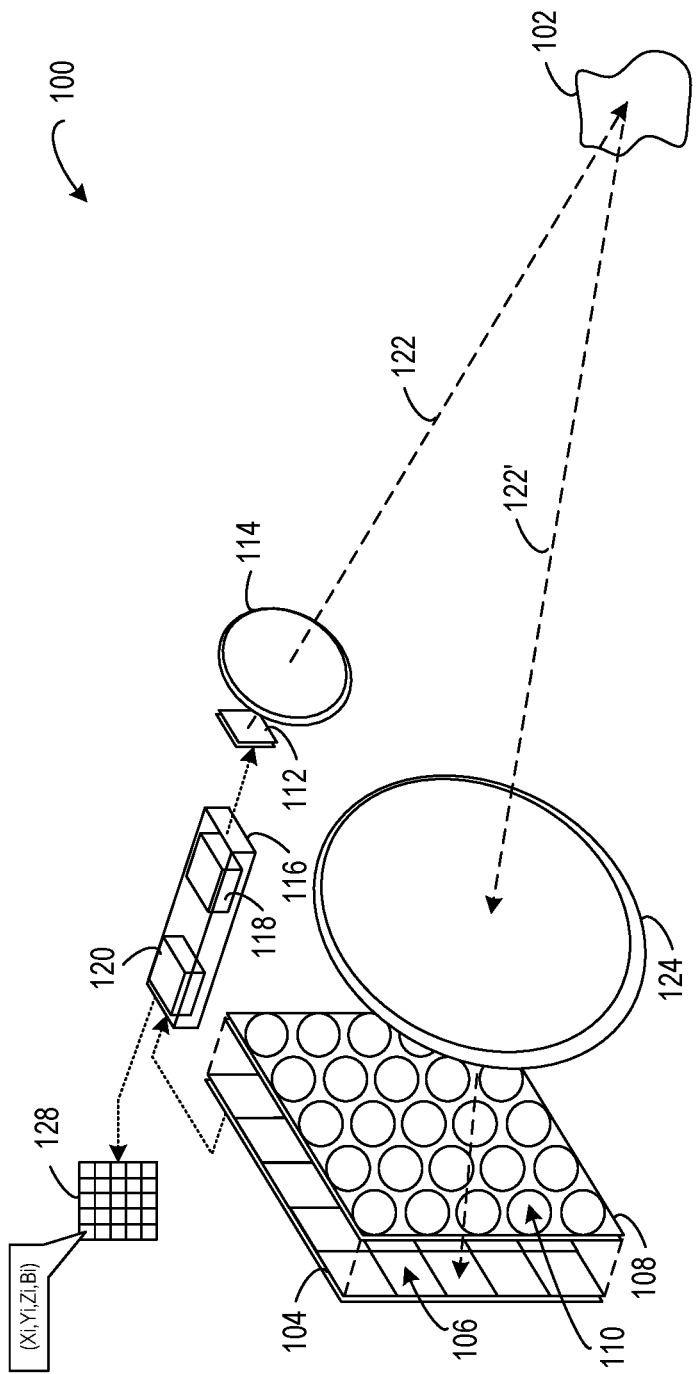
FIG. 1 is an exploded, schematic view of an example time-of-flight (ToF) camera.

FIG. 1 shows aspects of an example ToF camera 100 configured to operate in such a manner. The term 'camera' refers herein to any imaging component having at least one optical aperture and sensor array configured to image a scene or subject 102. Camera 100 includes a sensor array 104 of individually addressable sensors 106, also referred to as pixels. Each pixel 106 may further include a plurality of pixel taps, or detection units that each detects samples. In some implementations, the sensors may be complementary metal-oxide semiconductor (CMOS) elements, but other suitable architectures are also envisaged. Each sensor may be responsive to light over a broad wavelength band, although this is not required. For silicon-based sensors, the wavelength response may range from 300 to 1100 nm, for example. Sensor array 104 is schematically illustrated with twenty-five pixels 106 for simplicity, although any suitable number of pixels 106 may be used.

Microlens array 108 optionally may be arranged over sensor array 104. Microlens array 108 includes a plurality of microlens elements 110. Each microlens element 110 of microlens array 108 may be registered to a pixel 106 of the sensor array 104. When included, microlens array 108 may provide a larger effective fill factor at each of the sensors, for increased collection efficiency and reduced crosstalk between pixels.

A ToF illuminator 112 is configured to emit active IR light to illuminate the subject 102. In one example, the ToF illuminator 112 includes an IR laser configured to emit IR light. In some examples, the ToF illuminator 112 optionally may include a diffuser 114 covering a field of illumination of the ToF illuminator 112. Depth measurements may be taken using IR light, including NIR light, or any other suitable wavelength. Although not shown in FIG. 1, the camera optionally may include a bandpass filter to limit the portion of the electromagnetic spectrum reaching the sensors 106 to the portion of the electromagnetic spectrum emitted by the ToF illuminator 112.

Electronic controller 116 includes a logic machine and associated storage machine, examples of which are described in more detail below. The storage machine may hold instructions that cause the logic machine to enact any operation, algorithm, computation, or transformation disclosed herein. In some implementations, the logic machine may take the form of an application-specific integrated circuit (ASIC) or system-on-a-chip (SoC), in which some or all of the instructions are hardware- or firmware-encoded.

The electronic controller 116 includes a ToF controller machine 118 and an output machine 120 that may be operatively connected to the sensor array 104 and/or the ToF illuminator 112, which may be implemented via the above-mentioned logic machine and storage machine. Machines 118 and 120 may be implemented as separate physical hardware and/or firmware components or incorporated into a single hardware and/or firmware component. The ToF controller machine 118 is configured to repeatedly activate the ToF illuminator 112 and synchronously address the sensors 106 of sensor array 104 to acquire images. The active light signal emitted from the ToF illuminator 116 may be temporally modulated in different modulation frequencies for different image captures. In the illustrated example, the ToF controller machine 118 activates the ToF illuminator 112 to illuminate the subject 102 with active IR light 122 and addresses the sensors 106 of sensor array 104 in synchronicity. IR light 122' reflects from the subject 102 back to the camera 100. The reflected IR light 122' passes through receiving optics 124 and is incident on the sensors 106 of the sensor array 104 to provide a measurement. For example, the measurement may be an intensity measurement of active IR light back-reflected from the subject to the sensor. In the illustrated example, IR light 122' is measured by a pixel 106 of sensor array 104, thus providing phase information useable with the knowledge of the camera's configuration to determine the world space position of a locus of subject 102.

The ToF controller machine 118 is configured to generate a depth image 128 based on a plurality of captured IR images. The term 'depth image' refers to an array of image pixels registered to corresponding regions ($X_i$, $Y_i$) of an imaged scene, with a depth value $Z_i$ indicating, for each image pixel, the depth of the corresponding region. 'Depth' is defined as a coordinate parallel to the optical axis of the camera, which increases with increasing distance from the camera. The term 'depth video' refers herein to a time-resolved sequence of depth images. The output machine 120 is configured to output the depth image 128 generated by the ToF controller machine 118. The output machine 120 may be configured to output the depth image 128 in any suitable form. In some examples, the output machine 120 may output the depth image 128 as a data structure in which each element of the matrix corresponds to a different pixel.

Figure 2:
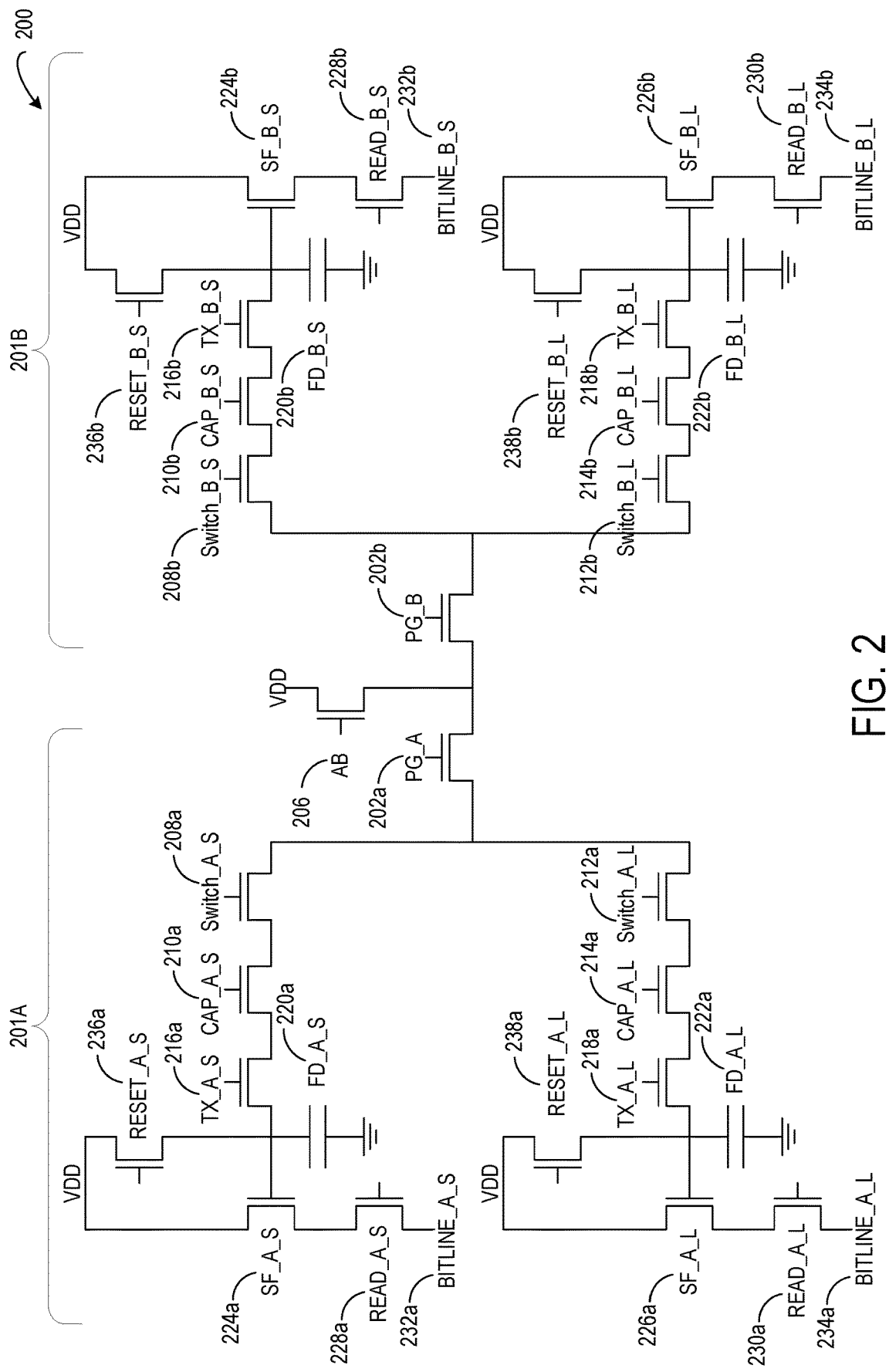
FIG. 2 schematically shows an electrical schematic diagram of an example ToF pixel.

FIG. 2 schematically shows an example ToF pixel 200 for a ToF camera in accordance with the present disclosure. Pixel 200 may be used as pixel 106 of ToF camera 100, for example. Pixel 200 includes two taps, indicated here as tap 201A and tap 201B via A and B labels on the illustrated components. In other examples, a pixel may include any other suitable number of taps. Each pixel tap includes a photogate, shown respectively at 202a and 202b (PG_A and PG_B) for taps 201A and 201B, configured to accumulate charge during an integration period. Pixel 200 also includes an anti-blooming gate (AB) 206.

Pixel tap 201A includes a short-exposure switch gate 208a (Switch_A_S), and pixel tap 201B includes a short-exposure switch gate 208b (Switch_B_S). Pixels taps 201A, 201B further respectively include long-exposure switch gates 212a, 212b (Switch_A_L and Switch_B_L). The short-exposure switch gates 208a, 208b and long-exposure switch gates 212a, 212b are operable to direct charge to a respective short-exposure storage node 210a, 210b (CAP_A_S and CAP_B_S) during a short-exposure interval of an integration period, and to direct charge to respective long-exposure storage nodes 214a, 214b (CAP_A_L and CAP_B_L) during a long-exposure interval of the integration period. While each storage node is illustrated herein as a capacitor, a storage node also may comprise a storage diode in some examples.

After integration of an image frame is complete, charges stored on the short-exposure storage nodes 210a, 210b are transferred respectively via operation of transfer gates 216a, 216b (TX_A_S and TX_B_S) to a readout mechanism for converting the charge to analog voltages. Likewise, charges stored on the long-exposure storage nodes 214a, 214b are transferred to the readout mechanism via operation of transfer gates 218a, 218b (TX_A_L and TX_B_L).

The readout mechanism in this example comprises short-exposure floating diffusion (FD) capacitors 220a, 220b (FD_A_S and FD_B_S), for converting charges transferred from the short-exposure storage nodes 210a, 210b into short-exposure voltage signals, and long-exposure FD capacitors 222a, 222b (FD_A_L and FD_B_L) for converting charges transferred from the long-exposure storage nodes 214a, 214b into long-exposure voltage signals. Charges on the short-exposure FD capacitors 220a, 220b are respectively measured as voltages across source followers 224a, 224b (SF_A_S and SF_B_S) by control of the read transistors 228a, 228b (READ_A_S and READ_B_S), and charges on the long-exposure FD capacitors 222a, 222b are respectively measured across source followers 226, 226b (SF_A_L and SF_B_L) by control of the read transistors 230a, 230b (READ_A_L and READ_B_L) for the long-exposure FD capacitors 222a, 222b. The measured voltages are communicated to one or more analog-to-digital converters (not shown) via bitlines 232a, 232b (BITLINE_A_S and BITLINE_B_S) and bitlines 234a, 234b (BITLINE_A_L and BITLINE_B_L). The short-exposure FD capacitors 220a, 220b and long-exposure FD capacitors 214a, 214b are respectively reset via reset gates 236a, 236b (RESET_A_S and RESET_B_S) and reset gates 238a, 238b (RESET_A_L and RESET_B_L) after measurement.

Figure 3:
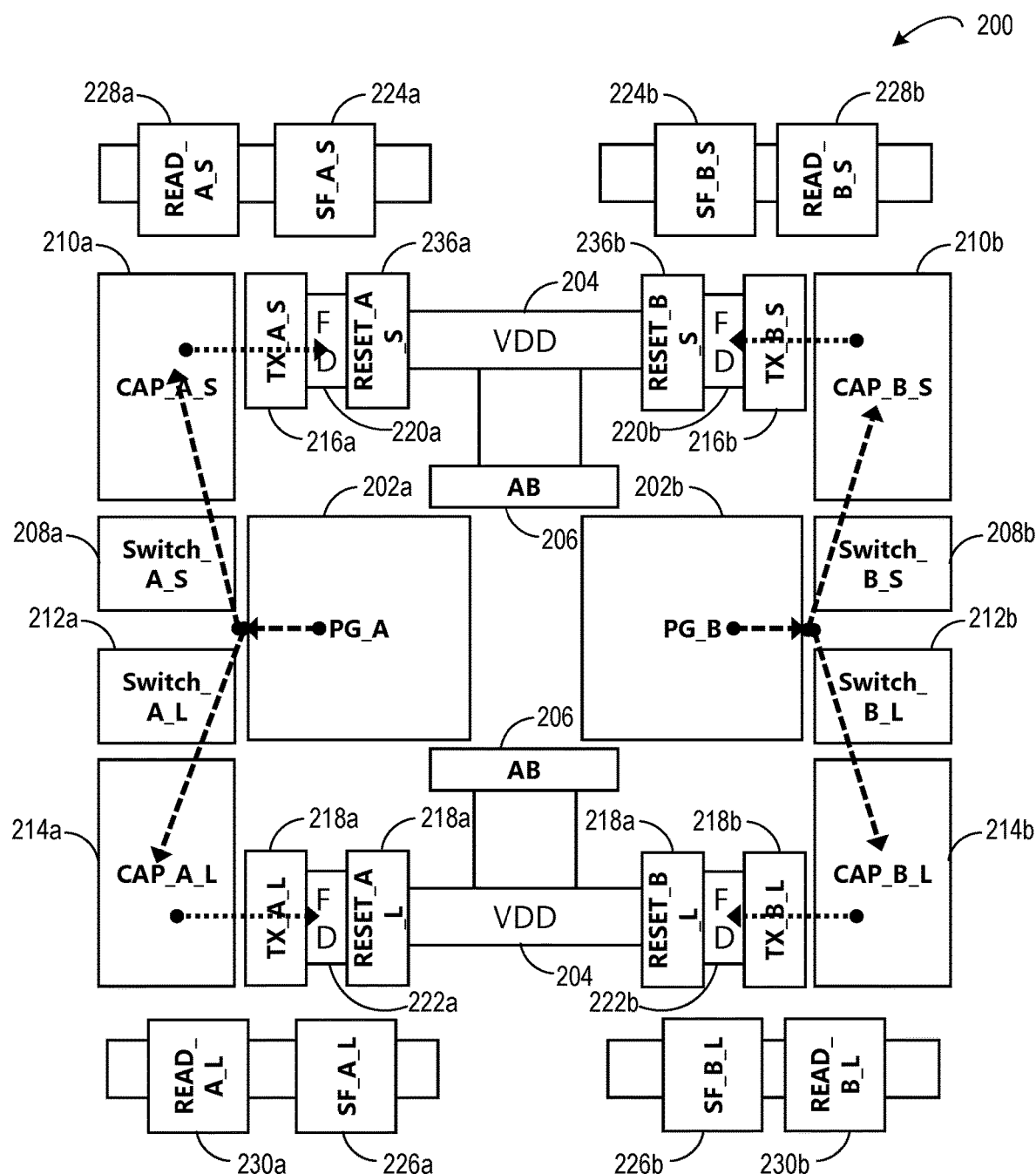
FIG. 3 shows a block diagram illustrating an example physical layout of the ToF pixel of FIG. 2.

FIG. 3 shows a block diagram illustrating an example layout of the pixel 200, and also schematically shows the flow of charge from each photogate through respective long-exposure and short-exposure storage nodes to FD capacitors. Compared to other example circuits described below in which storage nodes utilize shared FD capacitors, the use of individual floating diffusion capacitors for each storage node allows for comparatively faster imaging due to the parallel readout of all storage nodes, but also reduces the amount of pixel space available for each storage node. This may provide for less dynamic range, but faster operation, compared to pixels of a similar size in which multiple storage nodes share a common FD capacitor.

Figure 4:
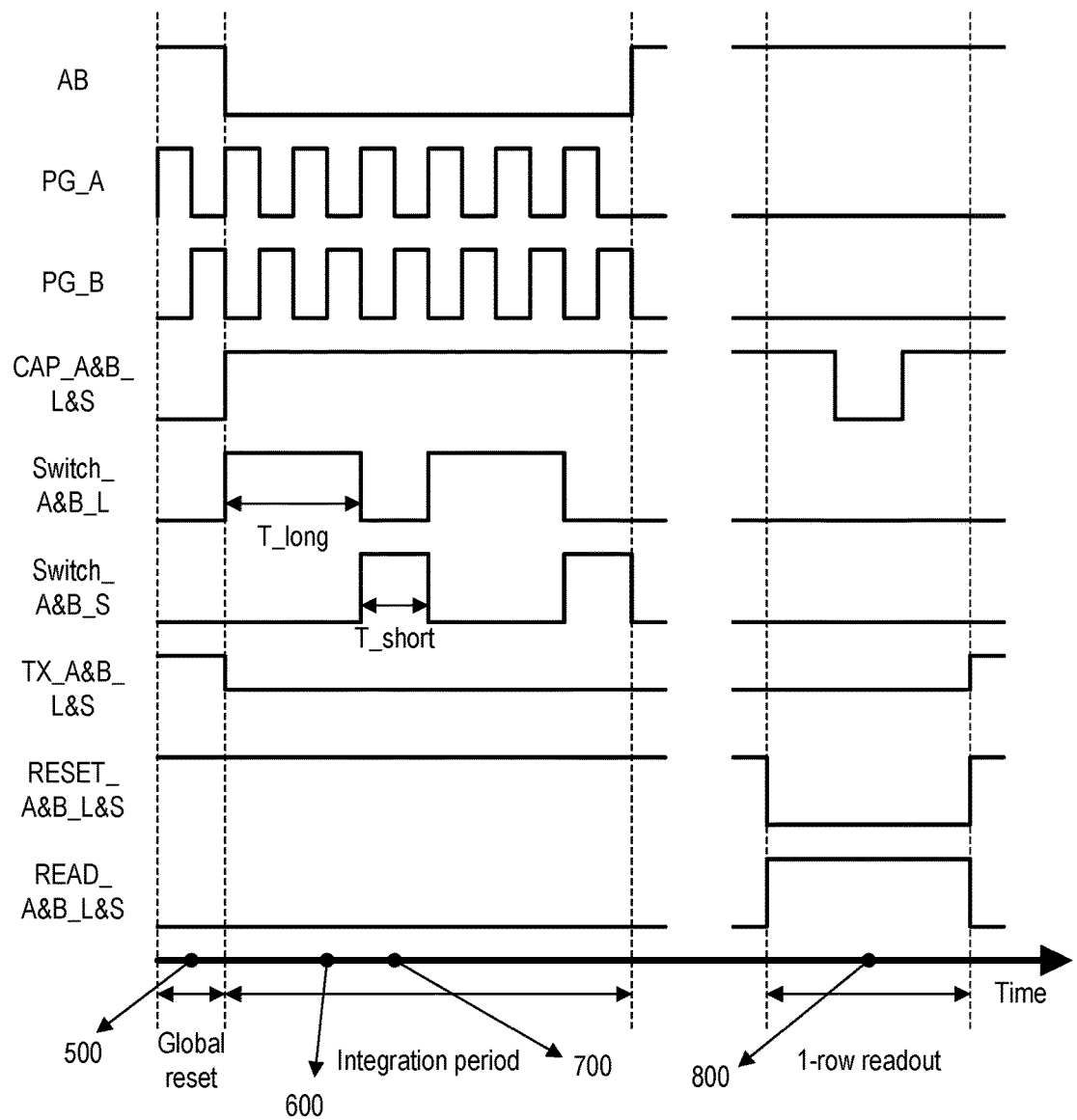
FIG. 4 shows an example timing diagram for the ToF pixel of FIG. 2.

FIG. 4 shows an example timing diagram 400 for the pixel 200 for one image frame. The frame includes a global reset period, an integration period in which light exposure is integrated by the pixel taps, and a readout period. As shown, PG_A and PG_B are modulated out of phase from each other, in a manner synchronized with the light source. During the global reset period, the anti-blooming gate (AB) is set to logic high, and during the integration period, the anti-blooming gate is set to logic low.

During image integration, the short-exposure switch gates (Switch A&B_S) and the long-exposure switch gates (Switch A&B_L) are operated to direct charge to the short-exposure storage nodes during a short-exposure interval (one portion of which is illustrated as T_short) of the integration period, and to direct charge to the long-exposure storage nodes during a long-exposure interval (one portion of which is illustrated as T_long) of the integration period. Signals from the long-exposure switch gates and short-exposure switch gates are controlled to switch states at timings aligned with the modulation of the photogate signals. As such, T_long and T_short are selected to be multiples of the period of the photogate modulation frequency. In some examples, the ratio of T_long to T_short may be variable such that they may be adjusted based upon conditions such as illumination light and noise levels.

FIGS. 5-8 show example potential diagrams 500, 600, 700 and 800 for the pixel of FIG. 2, representative of points in time indicated in FIG. 4. The potential diagrams of FIGS. 5-8 are shown for tap A, but it will be understood that other taps will operate in the same or similar manner.

Figure 5:
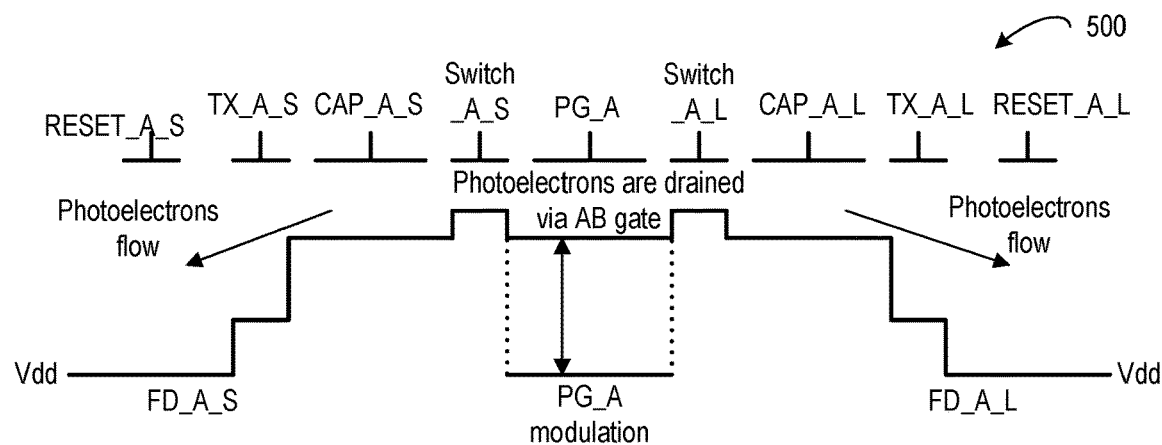
FIG. 5 shows an example potential diagram for the ToF pixel of FIG. 2 during global reset.
Figure 6:
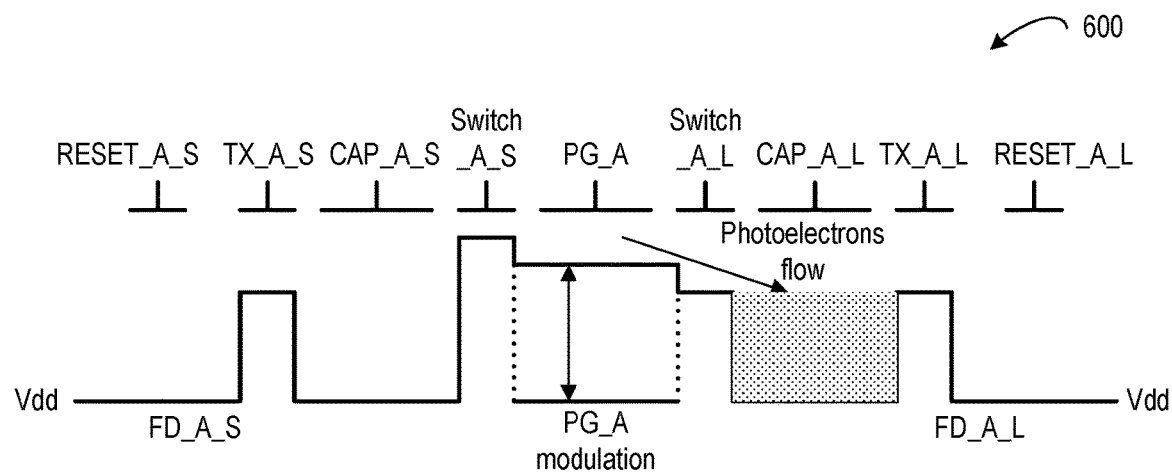
FIG. 6 shows an example potential diagram for the ToF pixel of FIG. 2 during a long-exposure interval of an integration period.
Figure 7:
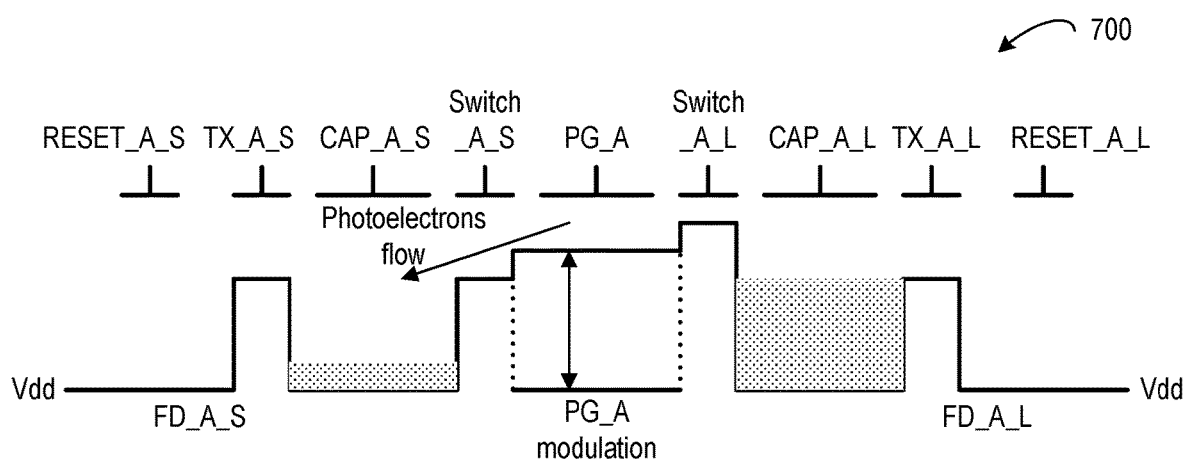
FIG. 7 shows an example potential diagram for the ToF pixel of FIG. 2 during a short-exposure interval of an integration period.
Figure 8:
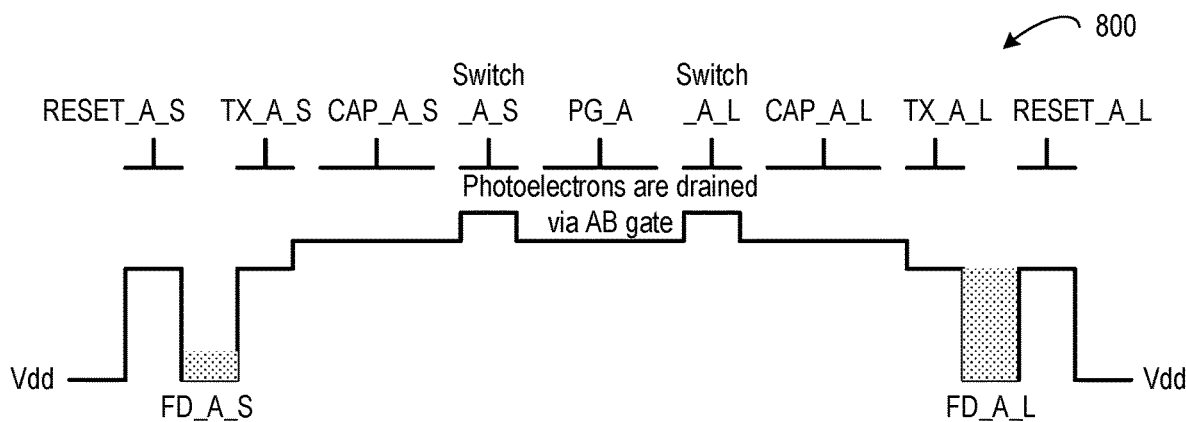
FIG. 8 shows an example potential diagram for the ToF pixel of FIG. 2 during a readout period.

FIG. 5 depicts potentials at various locations in the circuit during a global reset period. Charge is drained from PG_A via the antiblooming gate, and charge is drained from storage nodes CAP_A_S and CAP_A_L, to prepare the pixel to integrate charge. FIG. 6 depicts potentials during the long-exposure interval of the integration period. Here, long-exposure switch gate Switch_A_L and short-exposure switch gate Switch_A_S are controlled to direct charge to long-exposure storage node CAP_A_L. FIG. 7 depicts potentials during the short-exposure interval of the integration period. Here, the short-exposure switch gate Switch_A_S and long-exposure switch gate Switch_A_L are controlled to direct charge to short-exposure storage node CAP_A_S. FIG. 8 depicts potentials during the readout period, during which time charge is transferred to FD capacitor FD_A_S from short-exposure storage node CAP_A_S and charge is transferred to FD capacitor FD_A_L from long-exposure storage node CAP_A_L.

Figure 9:
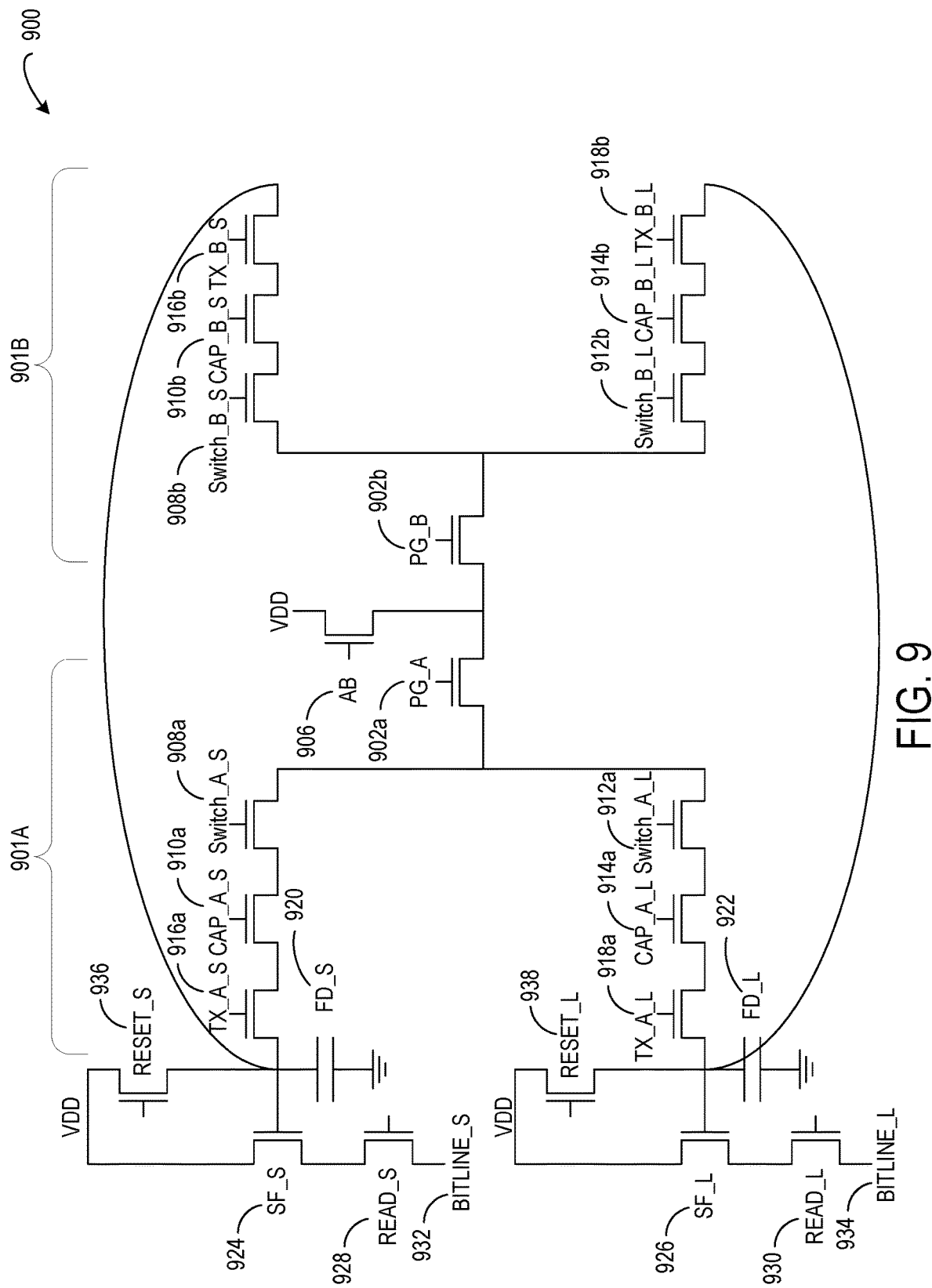
FIG. 9 schematically shows an electrical schematic diagram of another example ToF pixel.

FIG. 9 schematically shows an example pixel 900 in which FD capacitors are shared between storage nodes of tap 901A and tap 901B. Sharing FD capacitors between storage nodes may allow for the use of larger storage nodes and therefore higher dynamic range than the use of FD capacitors for each storage node, but also may result in slower readout due to reading out multiple taps in series per FD capacitor. Pixel 900 is another example of a pixel that may be used as pixel 106.

Pixel taps 901A, 901B include respective photogates 902a, 902b (PG_A and PG_B) configured to accumulate charge during an integration period. Pixel 900 also includes an anti-blooming gate (AB) 906. Each pixel tap 901A, 901B includes a respective short-exposure switch gate 908a, 908b (Switch_A_S and Switch_B_S) configured to direct charge to a corresponding short-exposure storage node 910a, 910b (CAP_A_S and CAP_B_S), and a respective long-exposure switch gate 912a, 912b (Switch_A_L and Switch_B_L) configured to direct charge to a corresponding long-exposure storage node 914a, 914b (CAP_A_L and CAP_B_L). After integration, charges stored on the short-exposure storage nodes 910a, 910b are transferred respectively via operation of transfer gates 916a, 916b (TX_A_S and TX_B_S) to a readout mechanism for converting the charges to analog voltages. Likewise, charges stored on the long-exposure storage nodes 914a, 914b are transferred to the readout mechanism via operation of transfer gates 918a, 918b (TX_A_L and TX_B_L).

The readout mechanism of FIG. 9 comprises a short-exposure FD capacitor 920 (FD_S) that is shared by tap 901A and tap 901B for converting charges transferred from the short-exposure storage nodes 910a, 910b into short-exposure voltage signals, and a long-exposure FD capacitor 922 (FD_L) that is shared by tap 901A and tap 901B for converting charges transferred from the long-exposure storage nodes 914a, 914b into long-exposure voltage signals. Charge stored on the short-exposure FD capacitor 920 is measured across a source follower 924 (SF_S), and charge on the long-exposure FD capacitor 922 is measured across a source follower 926 (SF_L) respectively by control of read transistor 928 (READ_S) for the short-exposure FD capacitor 920, and read transistor 930 (READ_L) for the long-exposure FD capacitor 922. The measured voltages are respectively communicated to one or more analog-to-digital converters (not shown) via bitline 932 (BITLINE_S) and bitline 934 (BITLINE_L). The short-exposure FD capacitor 920 and long-exposure FD capacitor 922 are drained respectively via reset gate 936 (RESET_S) and reset gate 938 (RESET_L) after measurement.

Figure 10:
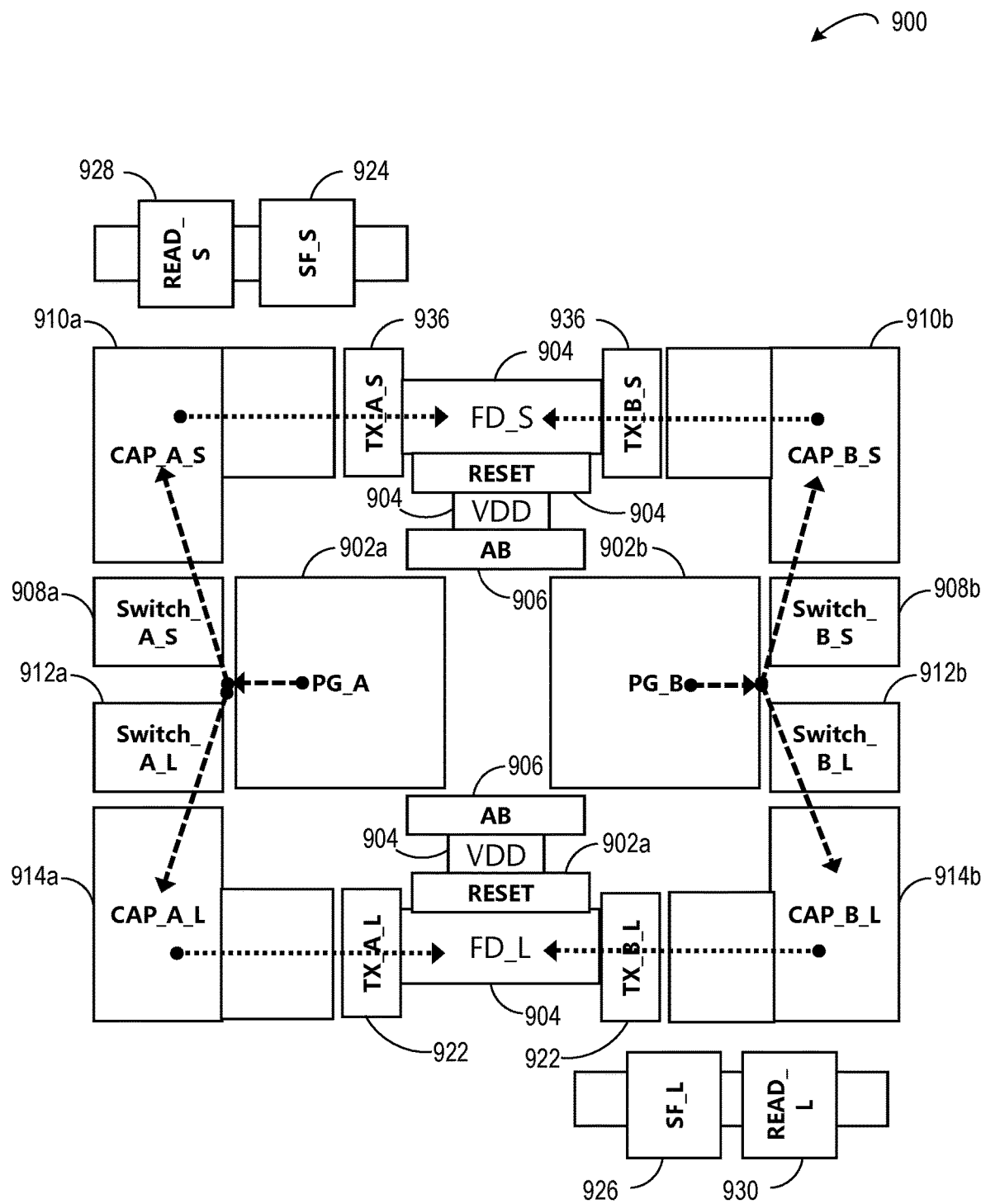
FIG. 10 shows a block diagram illustrating an example physical layout of the ToF pixel of FIG. 9.

FIG. 10 shows a block diagram illustrating an example layout of the pixel 900. Compared to the example circuit of FIG. 2, the use of shared floating diffusion capacitors by tap 901A and 901B allows for a reduced number of transistors per pixel. This may provide more pixel space for other components, such as a larger photodetector or storage nodes. However, operation of the pixel 900 is slower compared to the use of one FD capacitor per storage node for a given clock speed, as charge is read serially for the storage nodes that share a FD capacitor, rather than all nodes being read in parallel.

Figure 11:
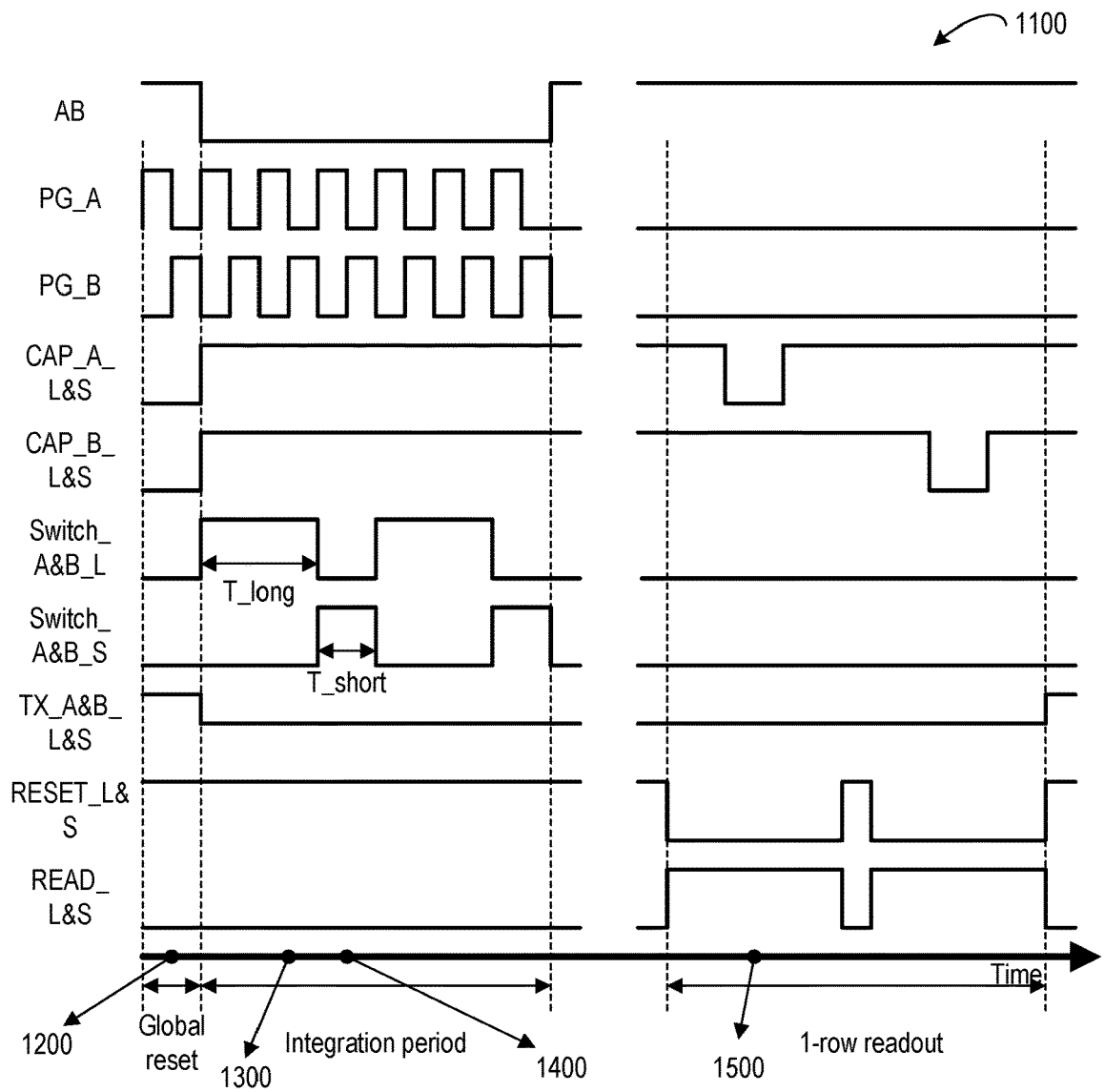
FIG. 11 shows an example timing diagram for the ToF pixel of FIG. 9.

FIG. 11 shows an example timing diagram 1100 for the pixel 900 for one frame. The frame includes a global reset period, an integration period in which light exposure is integrated by the pixel taps, and a readout period. During the global reset period, the anti-blooming gate (AB) is set to logic high, and then switched to logic low during the integration period. Short-exposure switch gates (Switch A&B_S) and long-exposure switch gates (Switch A&B_L) are operated to direct charge to the short-exposure storage nodes during a short-exposure interval (T_short) of the integration period, and to direct charge to the long-exposure storage nodes during a long-exposure (T_long) interval of the integration period. During readout, the readout of the storage nodes of pixel tap A (CAP_A_L&S) is followed by a reset, and then by the readout of the storage nodes of pixel tap B (CAP_B_L&S).

Figure 12:
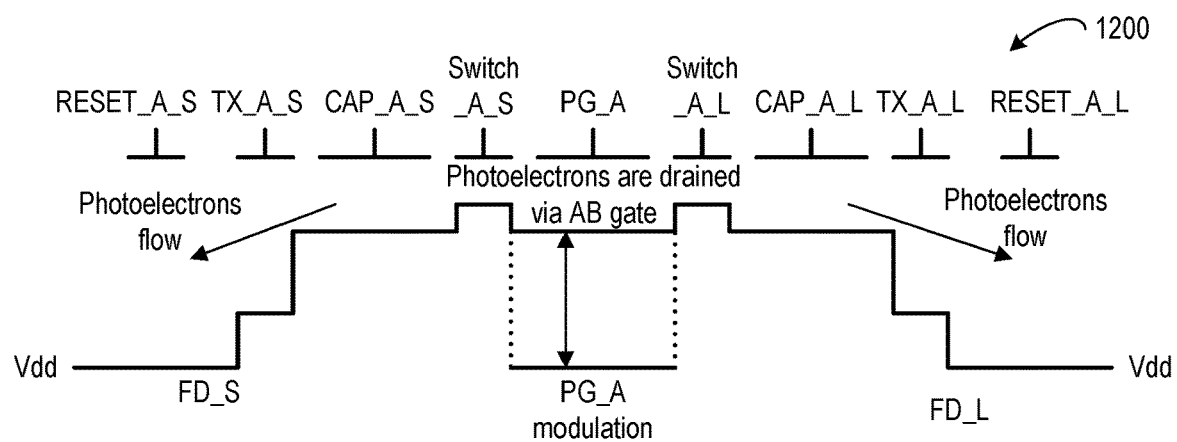
FIG. 12 shows an example potential diagram for the ToF pixel of FIG. 9 during global reset.

FIGS. 12-15 show example potential diagrams 1200, 1300, 1400 and 1500 for the pixel of FIG. 9, representative of points in time indicated in FIG. 11. FIG. 12 depicts potentials in the circuit during a global reset period. Charge is first drained to prepare the pixel to integrate charge.

Figure 13:
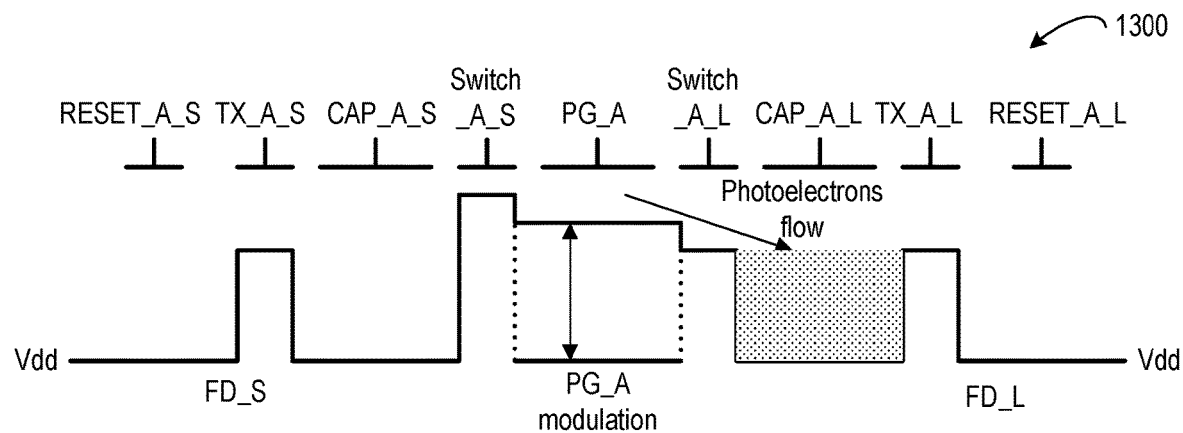
FIG. 13 shows an example potential diagram for the ToF pixel of FIG. 9 during a long-exposure interval of an integration period.
Figure 14:
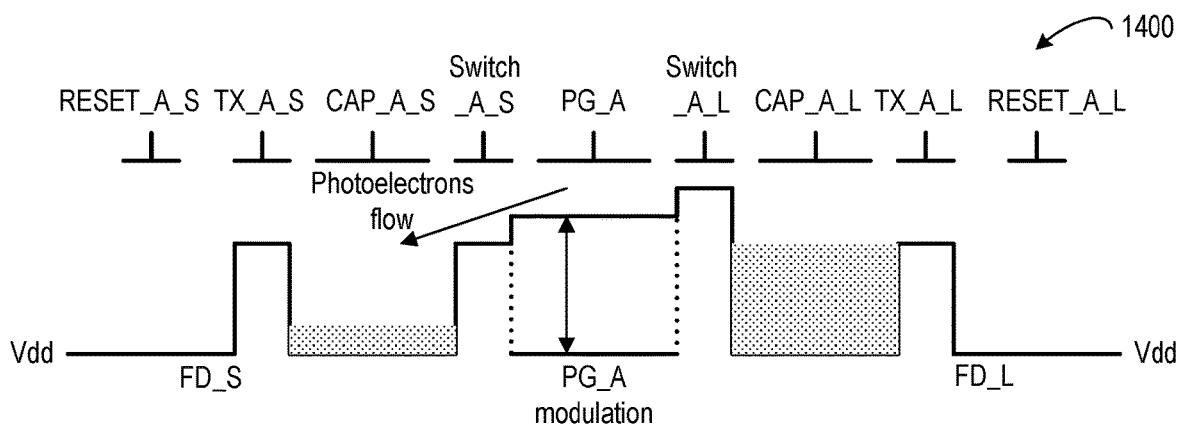
FIG. 14 shows an example potential diagram for the ToF pixel of FIG. 9 during a short-exposure interval of an integration period.
Figure 15:
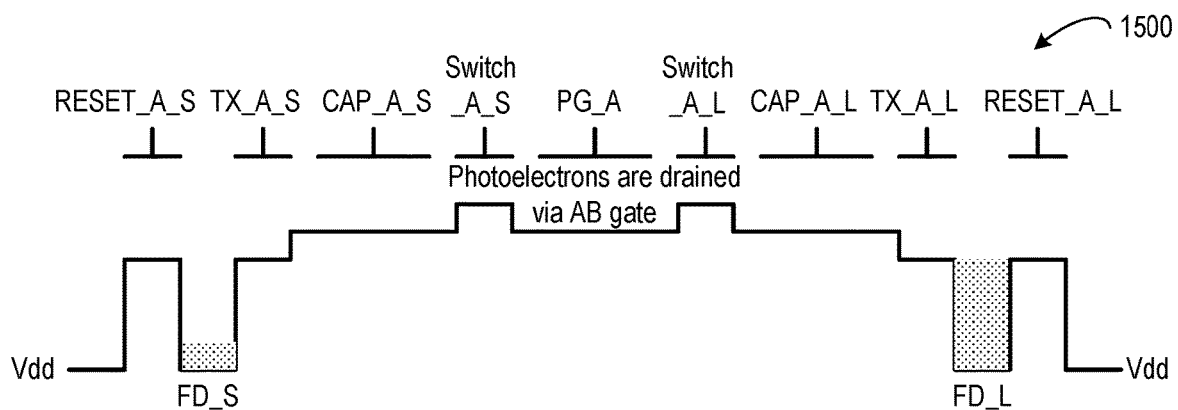
FIG. 15 shows an example potential diagram for the ToF pixel of FIG. 9 during a readout period.

FIG. 13 depicts potentials during the long-exposure interval of the integration period. Here, long-exposure switch gate Switch_A_L and short-exposure switch gate Switch_A_S are controlled to direct charge to long-exposure storage node CAP_A_L. FIG. 14 depicts potentials during the short-exposure interval of the integration period. Here, the short-exposure switch gate Switch_A_S and long-exposure switch gate Switch_A_L are controlled to direct charge to short-exposure storage node CAP_A_S. FIG. 15 depicts potentials during the readout period, where charge is transferred to FD capacitor FD_S from short-exposure storage node CAP_A_S, and charge is transferred to FD capacitor FD_L from long-exposure storage node CAP_A_L.

Figure 16:
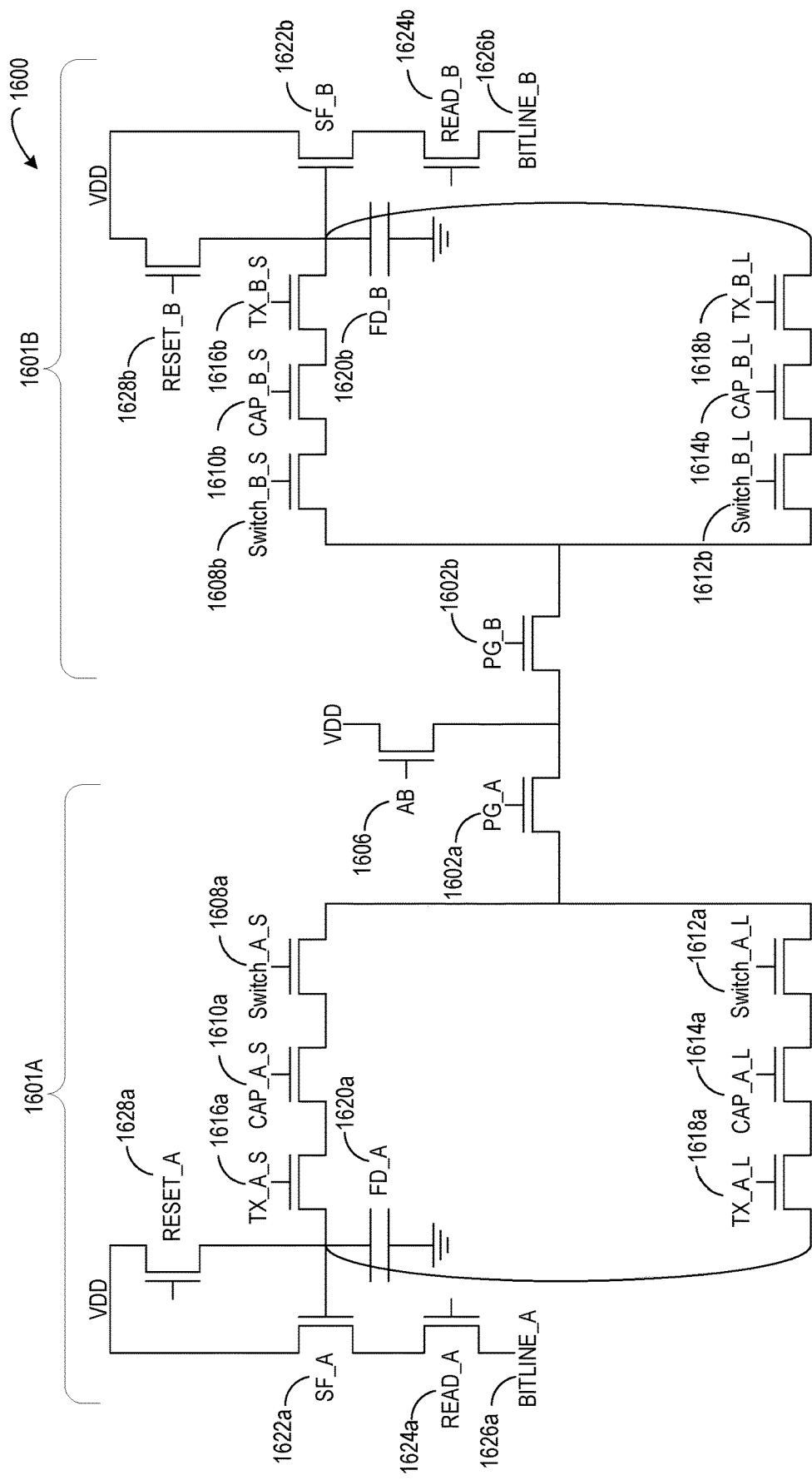
FIG. 16 schematically shows an electrical schematic diagram of another example ToF pixel.

FIG. 16 schematically shows an example pixel 1600 in which FD capacitors are shared between the short-exposure and long-exposure storage nodes in each of tap 1601A and tap 1601B. Pixel 1600 is another example of a pixel that may be used as pixel 106. Pixel taps A and B 1601A, 1601B respectively include photogates 1602a, 1602b (PG_A and PG_B) configured to accumulate charge during an integration period. Pixel 1600 also includes an anti-blooming gate (AB) 1606. Each pixel tap includes a short-exposure switch gate 1608a, 1608b (Switch_A_S and Switch_B_S) coupled to a short-exposure storage node 1610a, 1610b (CAP_A_S and CAP_B_S), and a long-exposure switch gate 1612a, 1612b (Switch_A_L and Switch_B_L) coupled to a long-exposure storage node 1614a, 1614b (CAP_A_L and CAP_B_L). During integration, the photogates and switch gates are operated to direct charge to the long and short-exposure storage nodes for respective long-exposure and short-exposure intervals, as described above. Transfer gates 1616a, 1616b (TX_A_S and TX_B_S) and transfer gates 1618a, 1618b (TX_A_L and TX_B_L) are controllable to transfer charge for readout after integration.

The readout mechanism of FIG. 16 comprises an FD capacitor 1620a (FD_A) shared by the short-exposure storage node 1610a and the long-exposure storage node 1610a of tap 1601A, and an FD capacitor 1620b (FD_B) shared by the short-exposure storage node 1610b and the long-exposure storage node 1610b of tap 1601B. Pixel 1600 further includes source follower 1622a (SF_A), read transistor 1624a (READ_A), source follower 1622b (SF_B), and read transistor 1624b (READ_B) operable to read charges on FD capacitors 1620a and 1620b. Measured voltages are communicated to one or more analog-to-digital converters (not shown) via bitline 1626a (BITLINE_A) and bitline 1626b (BITLINE_B). The FD capacitor 1620a and FD capacitor 1620b are drained respectively via reset gate 1628a (RESET_A) and reset gate 1628b (RESET_B) after measurement.

Figure 17:
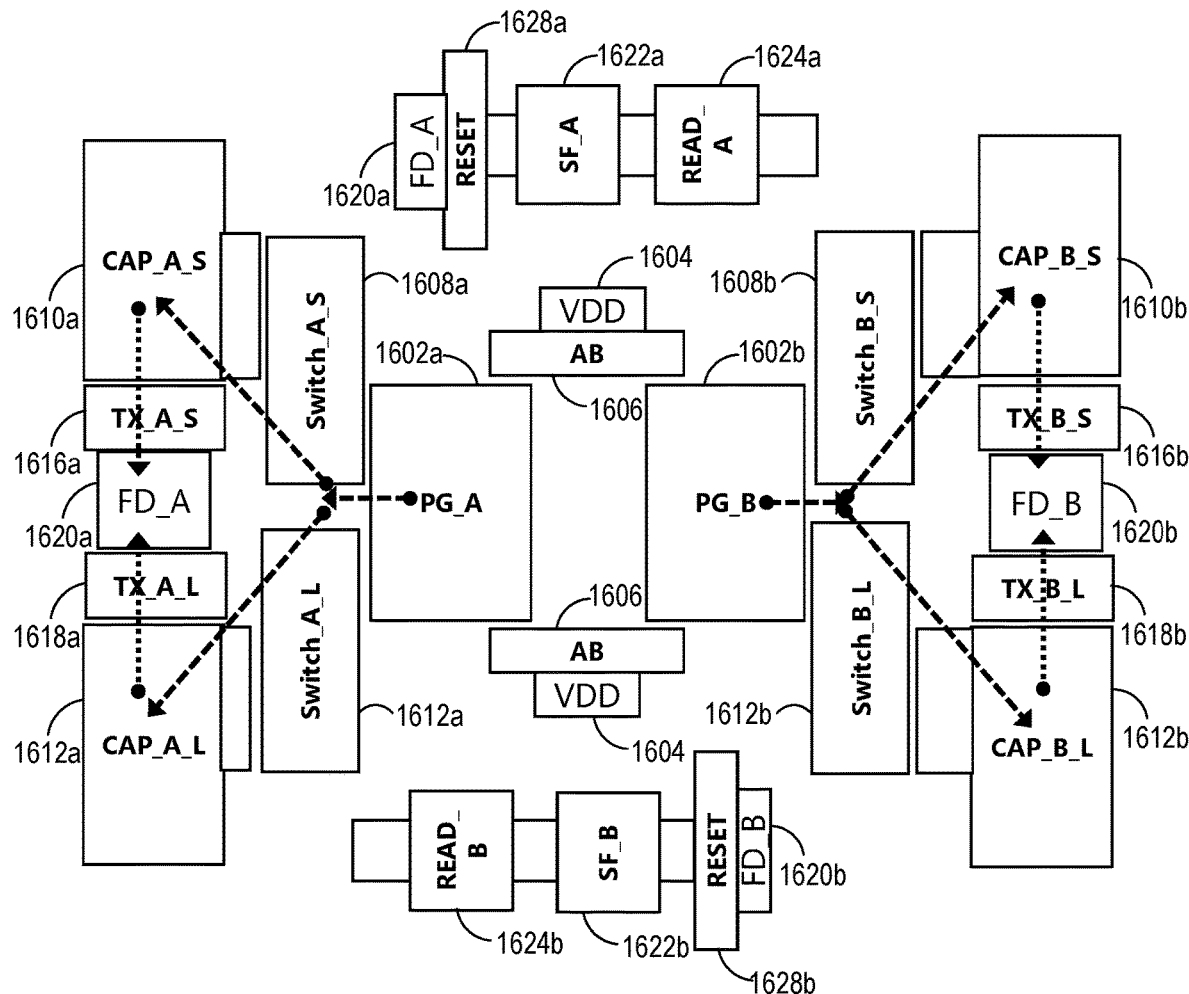
FIG. 17 shows a block diagram illustrating an example physical layout of the ToF pixel of FIG. 16.

FIG. 17 shows a block diagram illustrating an example layout of pixel 1600. As described above with regard to pixel 900, the sharing of FD capacitors by storage nodes in pixel 1600 may allow for the use of larger storage nodes, thereby helping to expand the dynamic range of the pixel. However, operation of pixel 1600 will be slower compared to the use of one FD capacitor per storage node for a given clock speed, as charge is read in series for the storage nodes that share a FD capacitor, rather than all nodes being read in parallel.

Figure 18:
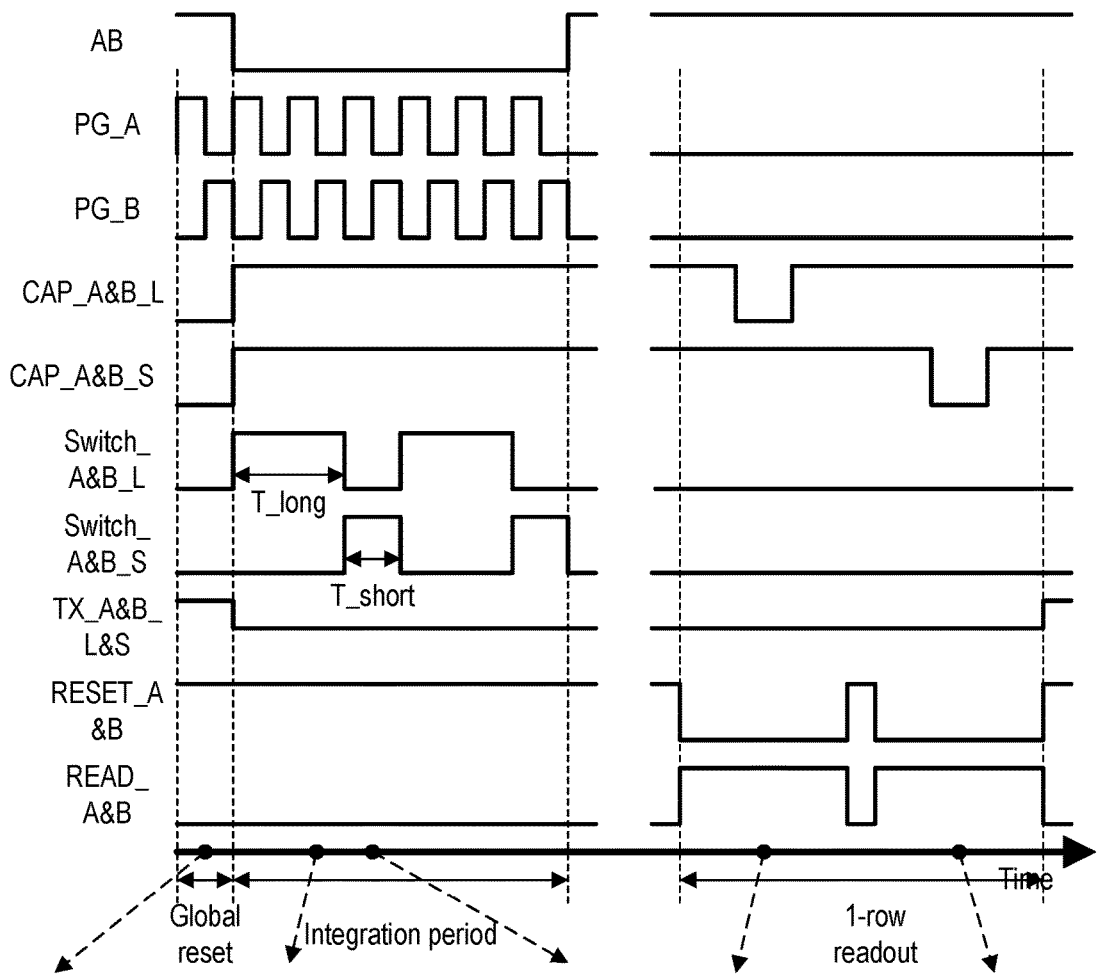
FIG. 18 shows an example timing diagram for the ToF pixel of FIG. 16.

FIG. 18 shows an example timing diagram 1800 for the pixel 1600 for one frame. The frame includes a global reset period, an integration period in which light exposure is integrated by the pixel taps, and a readout period. As described above with regard to FIG. 3, short-exposure switch gates (Switch_A&B_S) and long-exposure switch gates (Switch_A&B_L) are operable to direct charge to the short-exposure storage nodes during a short-exposure interval (T_short) of the integration period, and to direct charge to the long-exposure storage nodes during a long-exposure (T_long) interval of the integration period. During readout, readout of CAP_A_L&S is followed by a reset, and then by readout of CAP_B_L&S.

Figure 19:
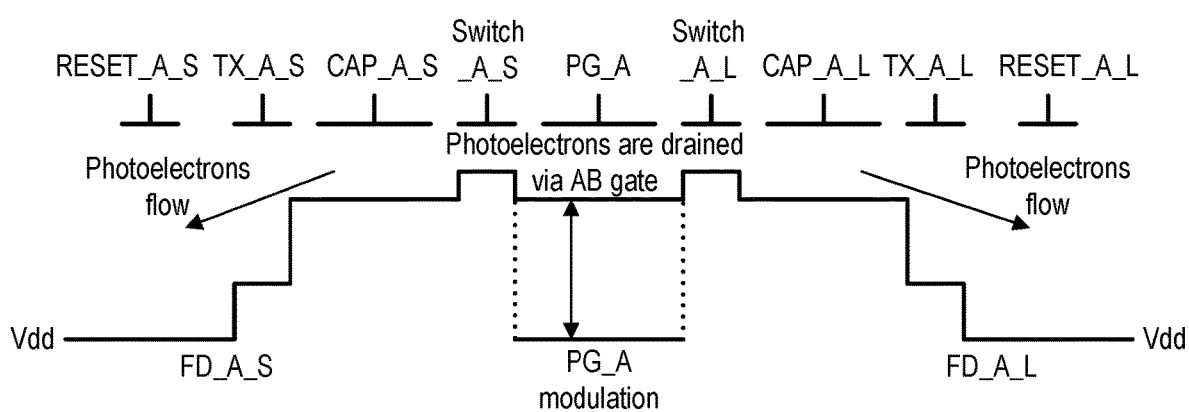
FIG. 19 shows an example potential diagram for the ToF pixel of FIG. 16 during global reset.

FIGS. 19-23 show example potential diagrams 1900, 2000, 2100 and 2200 for the pixel of FIG. 16, representative of points in time indicated in FIG. 18. FIG. 19 depicts potentials in the circuit during a global reset period. Charge is first drained to prepare the pixel to integrate charge.

Figure 20:
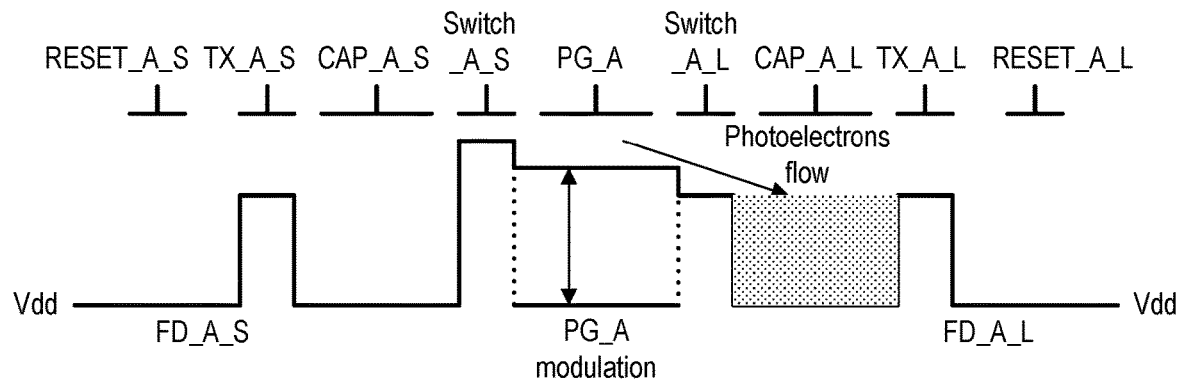
FIG. 20 shows an example potential diagram for the ToF pixel of FIG. 16 during a long-exposure interval of an integration period.
Figure 21:
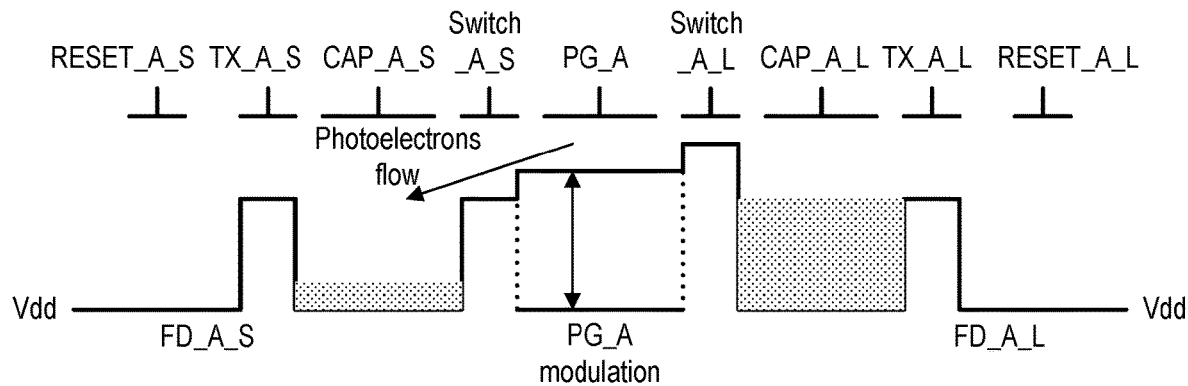
FIG. 21 shows an example potential diagram for the ToF pixel of FIG. 16 during a short-exposure interval of an integration period.
Figure 22:
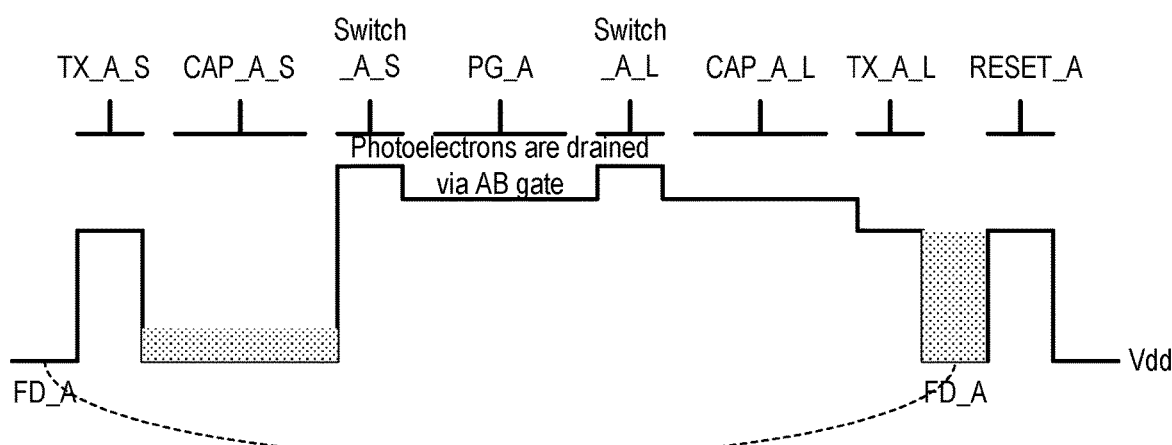
FIG. 22 shows an example potential diagram for the ToF pixel of FIG. 16 during a first portion of a readout period.
Figure 23:
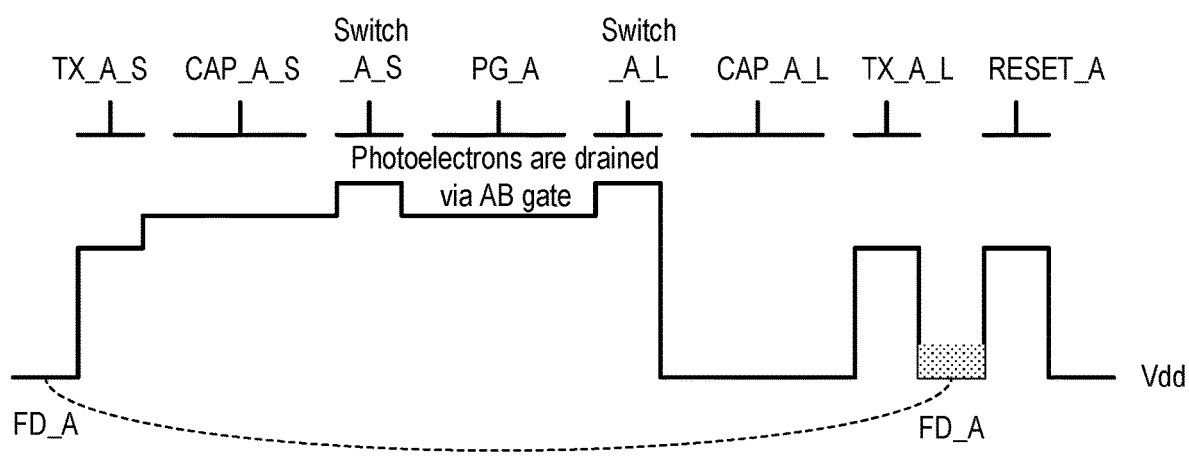
FIG. 23 shows an example potential diagram for the ToF pixel of FIG. 16 during a second portion of a readout period.

FIG. 20 depicts potentials during the long-exposure interval of the integration period. Here, long-exposure switch gate Switch_A_L and short-exposure switch gate Switch_A_S are controlled to direct charge to long-exposure storage node CAP_A_L. FIG. 21 depicts potentials during the short-exposure interval of the integration period. Here, the short-exposure switch gate Switch_A_S and long-exposure switch gate Switch_A_L are controlled to direct charge to short-exposure storage node CAP_A_S. FIG. 22 depicts potentials during the readout period when the long-exposure storage nodes CAP_A&B_L are read out. As shown, charge from long-exposure storage node CAP_A_L is transferred to FD capacitor FD_A. FIG. 23 depicts potentials during the readout period when the short-exposure storage nodes CAP_A&B_S are read out. As shown, the charge from short-exposure storage node CAP_A_S is transferred to FD capacitor FD_A.

Figure 24:
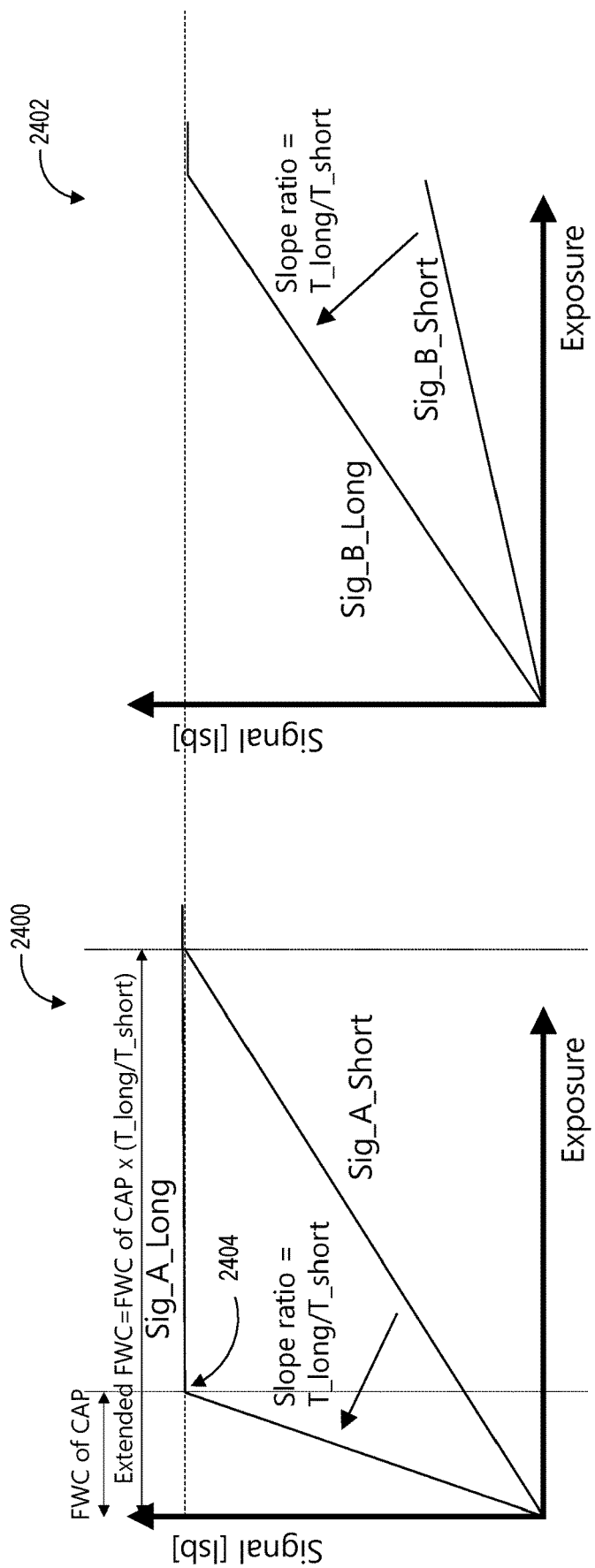
FIG. 24 shows example signal response plots illustrating accumulation of charge corresponding to long-exposure and short-exposure for an example ToF pixel.

FIG. 24 shows example signal v. exposure plots 2400 and 2402 for a ToF pixel as disclosed herein. Plot 2400 is an example of signal response for a first tap A, and plot 2402 is an example of signal response for a second tap B, versus integration time. For illustrative purposes, tap A is representative of a high light case while tap B is representative of a low light case. In tap A, the long-exposure signal Sig_A_Long reaches full-well capacity of the long-exposure storage node (CAP_A_L) relatively early on in the integration period, as indicated at 2404, while the short-exposure storage node (CAP_A_S) continues to accumulate charge. In tap B, the long-exposure signal Sig_B_Long from the long-exposure storage node (CAP_B_L) accumulates relatively more slowly than the long-exposure storage node (CAP_A_L) of tap A, representing lower illumination levels. Thus, in the case of tap A, where the long-exposure storage node is saturated, the signal from the short-exposure storage node may be used as a measure of the pixel exposure. In contrast, in the case of tap B, where the low signal on the short-exposure node may suffer from noise, the higher (but unsaturated) signal on the long-exposure storage node.

The effective full-well capacity (FWC) of the example pixels disclosed herein may be calculated using the following equation:

$$\text{Effective } FWC = FWC \text{ of } CAP \times (T\_long/T\_short)$$

where CAP is either of CAP_A_S or CAP_B_S. The slope ratio between Sig_A and Sig_B may be determined by the phase difference and demodulation contrast of the system. Further, the slope ratio between Sig_Long and Sig_Short may be calculated as the ratio between the long-exposure interval and the short-exposure interval (T_long/T_short).

Figure 25:
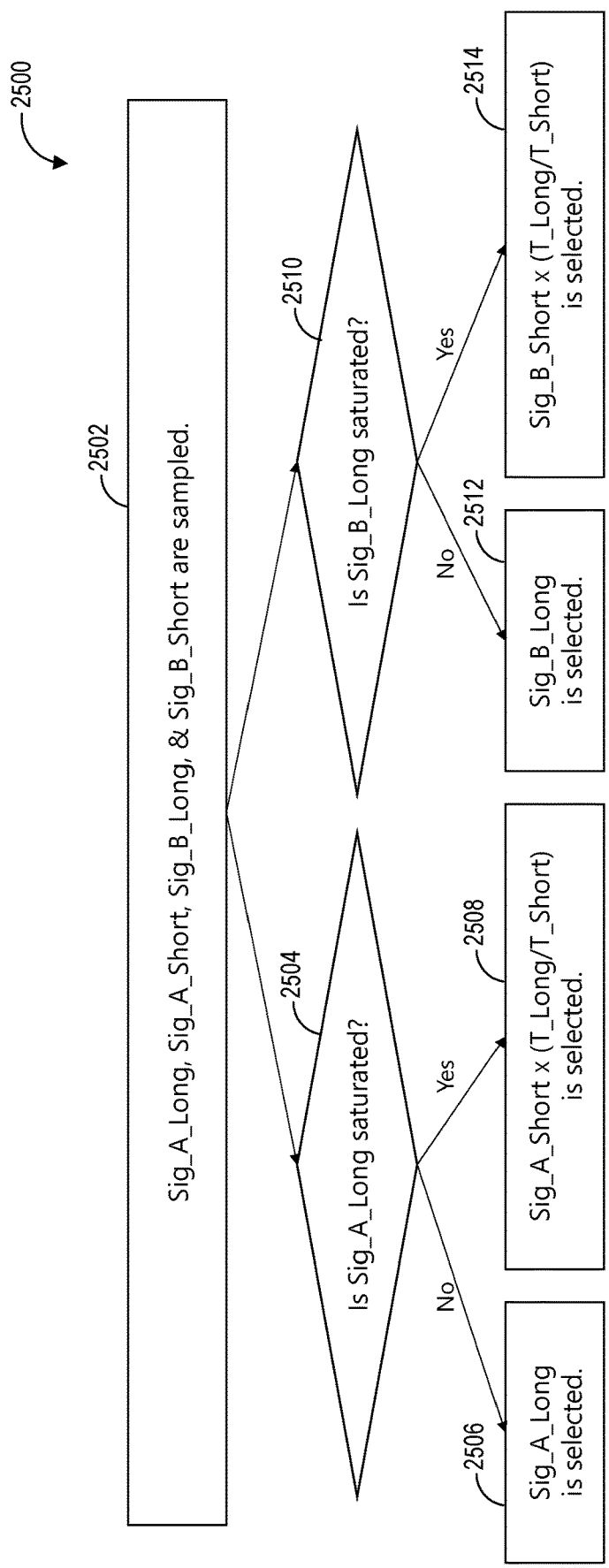
FIG. 25 shows a diagram for operating an example ToF pixel.

FIG. 25 shows an example method 2500 for determining a pixel signal in a two-tap ToF pixel that captures long-exposure and the short-exposure time signals for each tap. Method 2500 may be performed by electronic controller 116, for example. Method 2500 includes, at 2502, sampling Sig_A_Long, Sig_A_Short, Sig_B_Long and Sig_B_Short. Method 2500 further includes, at 2504, determining whether Sig_A_Long is saturated. If Sig_A_Long is not saturated, method 2500 includes selecting Sig_A_Long as the readout signal at 2506. On the other hand, if Sig_A_Long is saturated, method 2500 includes selecting Sig_A_Short× (T_long/T_short) as the readout signal at 2508.

Method 2500 also includes, at 2510, determining whether Sig_B_Long is saturated. If Sig_B_Long is not saturated, method 2500 includes selecting Sig_B_Long as the readout signal at 2512. On the other hand, if Sig_B_Long is saturated, method 2500 includes selecting Sig_B_Short× (T_long/T_short) as the readout signal at 2514.

In some examples, a ToF camera as disclosed herein may be configured to selectively operate in a non-HDR imaging mode, in addition to an HDR mode. In such a mode, a signal for a pixel tap may be determined by adding the total charges from the storage nodes of that taps.

Figure 26A:
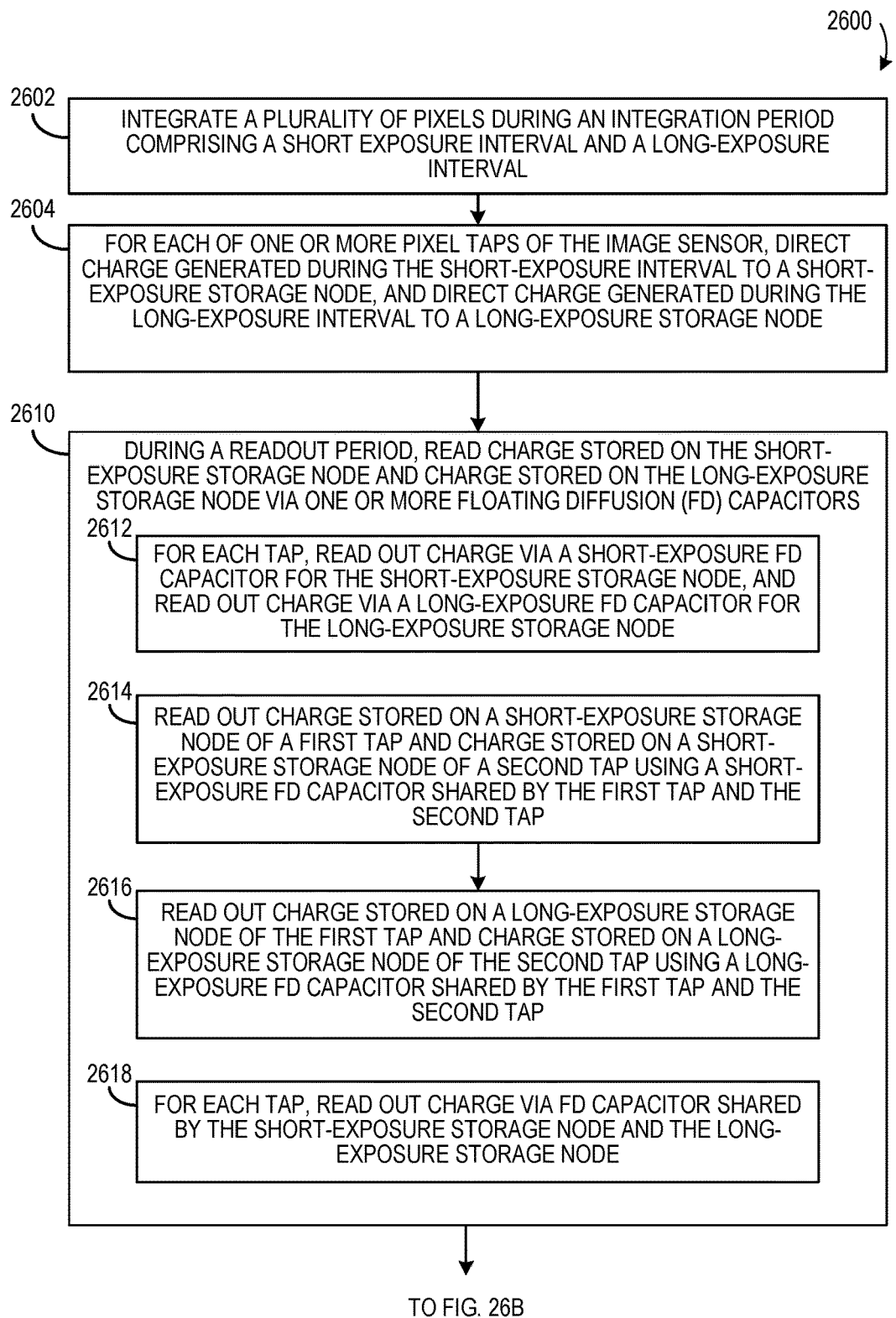
FIG. 26A-26B show a flow diagram illustrating another example method for operating a ToF system.
Figure 26B:
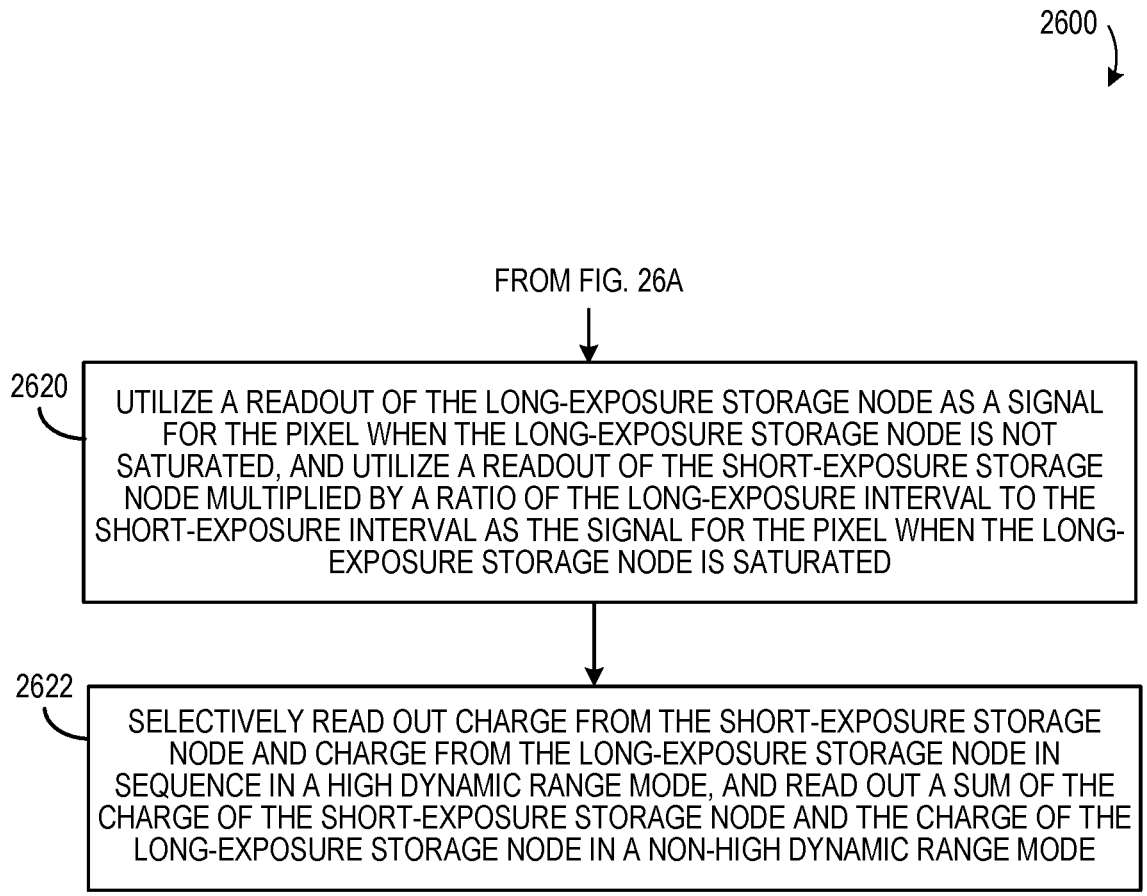

FIG. 26A-B show an example method 2600 of operating a ToF system. Method 2600 may be performed by electronic controller 116, for example. Method 2600 includes, at 2602, integrating a plurality of pixels during an integration period comprising a short exposure interval and a long-exposure interval. As described above, the short-exposure interval and long-exposure interval may be distributed across an integration period in alternating portions, and the long-exposure interval and the short exposure interval each may comprise a multiple of the integration period. Method 2600 further comprises, at 2604, for each of one or more pixel taps of the image sensor, directing charge generated during the short-exposure interval to a short-exposure storage node via a short-exposure switch gate and directing charge generated during the long-exposure interval to a long-exposure storage node via a long-exposure switch gate. Next, at 2610, method 2600 includes, during a readout period, reading charge stored on the short-exposure storage node and charge stored on the long-exposure storage node via one or more FD capacitors of a readout mechanism.

As described above, in various examples, FD capacitors may be utilized for each storage node of each tap, may be shared between taps, or may be shared by short-exposure and long-exposure storage nodes of a same tap. Thus, in some examples, method 2600 may include, at 2612, for each tap, reading out charge via a short-exposure FD capacitor for the short-exposure storage capacitor, and reading out charge via a long-exposure FD capacitor for the long-exposure storage capacitor. As mentioned above, the use of individual FD capacitors for each storage node in a tap allows for comparatively faster imaging due to the parallel readout of al storage nodes. However, this may also reduce the amount of pixel space for each storage node, resulting in less dynamic range.

In other examples, method 2600 may include, at 2614, reading out charge stored on a short-exposure storage node of a first tap and charge stored on a short-exposure storage node of a second tap using a short-exposure FD capacitor shared by the first tap and the second tap, and at 2616, reading out charge stored on a long-exposure storage node of the first tap and charge stored on a long-exposure storage node of the second tap using a long-exposure FD capacitor shared by the first tap and the second tap. The use of shared floating diffusion capacitors by a first tap and a second tap allows for a reduced number of transistors per pixel, as two signals are sampled per FD capacitor, thus allowing for more pixel area for bigger storage nodes for greater dynamic range, for example. However, this may be relatively slower compared to the use of individual FD capacitors for each storage node, as the signals are read out in sequence.

In yet other examples, method 2600 may include, at 2618, for each tap, reading out charge at an FD capacitor shared by the short-exposure storage node and the long-exposure storage node of the tap. Continuing with FIG. 26B, method 2600 includes, at 2620, utilizing a readout of the long-exposure storage node as a signal for the pixel when the long-exposure storage node is not saturated, and utilizing a readout of the short-exposure storage node multiplied by a ratio of the long-exposure interval to the short-exposure interval as the signal for the pixel when the long-exposure storage node is saturated.

In some examples, method 2600 may additionally include, at 2622, switching to a non-HDR depth sensing mode in which the short-exposure and long-exposure charges are summed for a tap. Such a mode may provide for a yet greater full-well capacity in some examples.

In some embodiments, the methods and processes described herein may be tied to a computing system of one or more computing devices. In particular, such methods and processes may be implemented as a computer-application program or service, an application-programming interface (API), a library, and/or other computer-program product.

Figure 27:
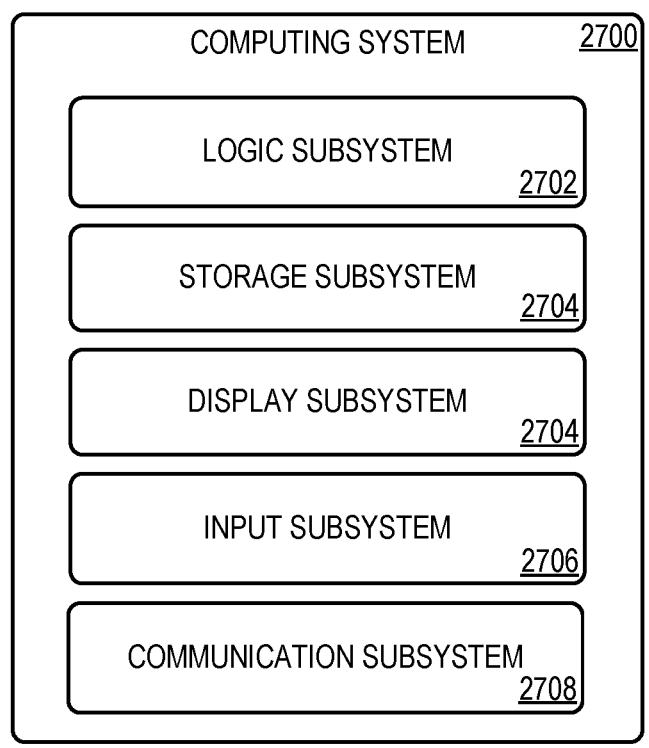
FIG. 27 is a block diagram showing an example computing system.

FIG. 27 schematically shows a non-limiting embodiment of a computing system 2700 that can enact one or more of the methods and processes described above. Computing system 2700 is shown in simplified form. Computing system 2700 may take the form of one or more personal computers, server computers, tablet computers, home-entertainment computers, network computing devices, gaming devices, mobile computing devices, mobile communication devices (e.g., smart phone), and/or other computing devices. Electronic controller 116 is an example of computing system.

Computing system 2700 includes a logic subsystem 2702 and a storage subsystem 2704. Computing system 2700 may optionally include a display subsystem 2706, input subsystem 2708, communication subsystem 2710, and/or other components not shown in FIG. 27.

Logic subsystem 2702 includes one or more physical devices configured to execute instructions. For example, logic subsystem 2702 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Logic subsystem 2702 may include one or more processors configured to execute software instructions. Additionally or alternatively, logic subsystem 2702 may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage subsystem 2704 includes one or more physical devices configured to hold instructions executable by the logic machine to implement the methods and processes described herein. When such methods and processes are implemented, the state of storage subsystem 2704 may be transformed—e.g., to hold different data.

Storage subsystem 2704 may include removable and/or built-in devices. Storage subsystem 2704 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 2704 may include volatile, nonvolatile, dynamic, static, read/write, read-only, random-access, sequential-access, location-addressable, file-addressable, and/or content-addressable devices.

It will be appreciated that storage subsystem 2704 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 2702 and storage subsystem 2704 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 2704 may be used to present a visual representation of data held by storage subsystem 2704. This visual representation may take the form of a graphical user interface (GUI). As the herein described methods and processes change the data held by the storage machine, and thus transform the state of the storage machine, the state of display subsystem 2704 may likewise be transformed to visually represent changes in the underlying data. Display subsystem 2704 may include one or more display devices utilizing virtually any type of technology. Such display devices may be combined with logic subsystem 2702 and/or storage subsystem 2704 in a shared enclosure, or such display devices may be peripheral display devices.

When included, input subsystem 2706 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 2708 may be configured to communicatively couple computing system 2700 with one or more other computing devices. Communication subsystem 2708 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 2700 to send and/or receive messages to and/or from other devices via a network such as the Internet.

Another example provides a time-of-flight camera, comprising a global shutter image sensor comprising a plurality of pixels, each pixel of the plurality of pixels comprising one or more taps, each tap comprising a photogate, a short-exposure storage node configured to receive charge during a short-exposure interval of an integration period, a long-exposure storage node configured to receive charge during a long-exposure interval of the integration period, a short-exposure switch gate configured to direct charge generated during the short-exposure interval to the short-exposure storage node, a long-exposure switch gate configured to direct charge generated during the long-exposure period to the long-exposure storage node, and a readout mechanism comprising one or more floating diffusion (FD) capacitors. The one or more taps may additionally or alternatively include a first tap and a second tap, and the readout mechanism may additionally or alternatively include a short-exposure FD capacitor configured to receive charge from a short-exposure storage node of the first tap and to receive charge from a short-exposure storage node of the second tap, and a long-exposure FD capacitor configured to receive charge from a long-exposure storage node of the first tap and a long exposure storage node of the second tap. The readout mechanism may additionally or alternatively include, for each tap, a long-exposure FD capacitor and a short-exposure FD capacitor. The readout mechanism may additionally or alternatively include, for each tap, a shared FD capacitor configured to receive charge from the short-exposure storage node and from the long-exposure storage node of the tap. The time-of-flight camera may additionally or alternatively include a controller configured to selectively readout charge from the short-exposure storage node and charge from the long-exposure storage node in sequence in a high dynamic range mode, and readout a sum of the charge from the short-exposure storage node and the charge from the long-exposure storage node in a non-high dynamic range mode. The readout mechanism may additionally or alternatively include instructions executable to utilize a readout of the long-exposure storage node as a signal for the pixel when the long-exposure storage node is not saturated, and to utilize a readout of the short-exposure storage node multiplied by a ratio of the long-exposure interval to the short-exposure interval as the signal for the pixel when the long-exposure storage node is saturated. The ratio of the long-exposure interval to the short-exposure interval may additionally or alternatively be variable. The time-of-flight camera may additionally or alternatively include an anti-blooming gate. Each of the short-exposure storage node and the long-exposure storage node may additionally or alternatively include one or more of a storage capacitor or a storage diode.

Another example provides a method of operating a time-of-flight camera, the method comprising integrating a plurality of pixels via a global shutter during an integration period comprising a short-exposure interval and a long-exposure interval, each pixel of the plurality of pixels comprising one or more taps for each tap, directing charge generated during the short-exposure interval to a short-exposure storage node via a short-exposure switch gate, and directing charge generated during the long-exposure interval to a long-exposure storage node via a long-exposure switch gate, and during a readout period, reading out charge stored on the short-exposure storage node and charge stored on the long-exposure storage node via one or more floating diffusion (FD) capacitors. Reading out charge may additionally or alternatively include, for each tap, reading out charge via a short-exposure FD capacitor for the short-exposure storage node, and reading charge via a long-exposure FD capacitor for the long-exposure storage node. Reading out the charge stored on the short-exposure storage node may additionally or alternatively include reading out the charge stored on a short-exposure storage node of a first tap and charge stored on a short-exposure storage node of a second tap using a short-exposure FD capacitor shared by the first tap and the second tap, and reading out the charge stored on the long-exposure storage node comprises reading out the charge stored on a long-exposure storage node of the first tap and charge stored on a long-exposure storage node of the second tap using a long-exposure FD capacitor shared by the first tap and the second tap. Reading charge may additionally or alternatively include, for each tap, reading charge at a FD capacitor shared by the short-exposure storage node and the long-exposure storage node for the tap. The method may additionally or alternatively include selectively reading out charge from the short-exposure storage node and charge from the long-exposure storage node in sequence in a high dynamic range mode, and reading out a sum of the charge from the short-exposure storage node and the charge from the long-exposure storage node in a non-high dynamic range mode. The method may additionally or alternatively include utilizing a readout of the long-exposure storage node as a signal for the pixel when the long-exposure storage node is not saturated, and utilizing a readout of the short-exposure storage node multiplied by a ratio of the long-exposure interval to the short-exposure interval as the signal for the pixel when the long-exposure storage node is saturated.

Another example provides a time-of-flight camera, comprising a global shutter image sensor comprising a plurality of pixels, each pixel of the plurality of pixels comprising one or more taps, each tap comprising a photogate, a short-exposure storage node configured to receive charge during a short-exposure interval of an integration period, a long-exposure storage node configured to receive charge during a long-exposure interval of the integration period, a short-exposure switch gate configured to direct charge generated during the short-exposure interval to the short-exposure storage node, a long-exposure switch gate configured to direct charge generated during the long-exposure interval to the long-exposure storage node, a readout mechanism comprising one or more floating diffusion (FD) capacitors, and instructions executable to determine a long-exposure signal and a short-exposure signal, if the long-exposure signal is not saturated, read out the long-exposure signal as a pixel signal, and if the long-exposure signal is saturated, read out the short-exposure signal multiplied by a ratio of the long-exposure interval to the short-exposure interval as the pixel signal. The one or more taps may additionally or alternatively include a first tap and a second tap, and the readout mechanism may additionally or alternatively include a short-exposure FD capacitor configured to receive charge from a short-exposure storage node of the first tap and to receive charge from a short-exposure storage node of the second tap, and a long-exposure FD capacitor configured to receive charge from a long-exposure storage node of the first tap and a long exposure storage node of the second tap. The readout mechanism may additionally or alternatively include, for each tap, a long-exposure FD capacitor; and a short-exposure FD capacitor. The readout mechanism may additionally or alternatively include for each tap, a shared FD capacitor configured to receive charge from the short-exposure storage node and from the long-exposure storage node. The time-of-flight camera may additionally or alternatively include a controller configured to selectively readout charge from the short-exposure storage node and charge from the long-exposure storage node in sequence in a high dynamic range mode, and readout a sum of the charge from the short-exposure storage node and the charge from the long-exposure storage node in a non-high dynamic range mode.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A time-of-flight camera, comprising:
a global shutter image sensor comprising a plurality of pixels, each pixel of the plurality of pixels comprising one or more taps, each tap comprising
a photogate,
a short-exposure storage node configured to receive charge during a short-exposure interval of an integration period,
a long-exposure storage node configured to receive charge during a long-exposure interval of the integration period,
a short-exposure switch gate in series with the photogate, the short-exposure switch gate configured to direct charge generated during the short-exposure interval to the short-exposure storage node,
a long-exposure switch gate in series with the photogate and in parallel with the short-exposure switch gate, the long-exposure switch gate configured to direct charge generated during the long-exposure period to the long-exposure storage node, and
a readout mechanism comprising one or more floating diffusion (FD) capacitors.

2. The time-of-flight camera of claim 1, wherein the one or more taps comprises a first tap and a second tap, and wherein the readout mechanism comprises
a short-exposure FD capacitor configured to receive charge from the short-exposure storage node of the first tap and to receive charge from the short-exposure storage node of the second tap, and a long-exposure FD capacitor configured to receive charge from the long-exposure storage node of the first tap and to receive charge from the long exposure storage node of the second tap.

3. The time-of-flight camera of claim 1, wherein the readout mechanism comprises, for each tap, a long-exposure FD capacitor and a short-exposure FD capacitor.

4. The time-of-flight camera of claim 1, wherein the readout mechanism comprises, for each tap, a shared FD capacitor configured to receive charge from the short-exposure storage node and from the long-exposure storage node of the tap.

5. The time-of-flight camera of claim 4, further comprising a controller configured to selectively readout charge from the short-exposure storage node and charge from the long-exposure storage node in sequence in a high dynamic range mode, and readout a sum of the charge from the short-exposure storage node and the charge from the long-exposure storage node in a non-high dynamic range mode.

6. The time-of-flight camera of claim 1, wherein the readout mechanism comprises instructions executable to utilize a readout of the long-exposure storage node as a signal for the pixel when the long-exposure storage node is not saturated, and to utilize a readout of the short-exposure storage node multiplied by a ratio of the long-exposure interval to the short-exposure interval as the signal for the pixel when the long-exposure storage node is saturated.

7. The time-of-flight camera of claim 1, wherein the ratio of the long-exposure interval to the short-exposure interval is variable.

8. The time-of-flight camera of claim 1, further comprising an anti-blooming gate.

9. The time-of-flight camera of claim 1, wherein each of the short-exposure storage node and the long-exposure storage node comprises one or more of a storage capacitor or a storage diode.

10. A method of operating a time-of-flight camera, the method comprising:
integrating a plurality of pixels via a global shutter during an integration period comprising a short-exposure interval and a long-exposure interval, each pixel of the plurality of pixels comprising one or more taps;
for each tap,
directing charge generated during the short-exposure interval to a short-exposure storage node via a short-exposure switch gate, and
directing charge generated during the long-exposure interval to a long-exposure storage node via a long-exposure switch gate; and
during a readout period,
reading out charge stored on the short-exposure storage node and charge stored on the long-exposure storage node via one or more floating diffusion (FD) capacitors.

11. The method of claim 10, wherein reading out charge comprises, for each tap, reading out charge via a short-exposure FD capacitor for the short-exposure storage node, and reading charge via a long-exposure FD capacitor for the long-exposure storage node.

12. The method of claim 10, wherein
reading out the charge stored on the short-exposure storage node comprises reading out the charge stored on a short-exposure storage node of a first tap and charge stored on a short-exposure storage node of a second tap using a short-exposure FD capacitor shared by the first tap and the second tap, and
reading out the charge stored on the long-exposure storage node comprises reading out the charge stored on a long-exposure storage node of the first tap and charge stored on a long-exposure storage node of the second tap using a long-exposure FD capacitor shared by the first tap and the second tap.

13. The method of claim 10, wherein reading charge comprises, for each tap, reading charge at a FD capacitor shared by the short-exposure storage node and the long-exposure storage node for the tap.

14. The method of claim 13, further comprising selectively reading out charge from the short-exposure storage node and charge from the long-exposure storage node in sequence in a high dynamic range mode, and reading out a sum of the charge from the short-exposure storage node and the charge from the long-exposure storage node in a non-high dynamic range mode.

15. The method of claim 10, further comprising utilizing a readout of the long-exposure storage node as a signal for the pixel when the long-exposure storage node is not saturated, and utilizing a readout of the short-exposure storage node multiplied by a ratio of the long-exposure interval to the short-exposure interval as the signal for the pixel when the long-exposure storage node is saturated.

16. A time-of-flight camera, comprising:
a global shutter image sensor comprising a plurality of pixels, each pixel of the plurality of pixels comprising one or more taps, each tap comprising
a photogate,
a short-exposure storage node configured to receive charge during a short-exposure interval of an integration period, a long-exposure storage node configured to receive charge during a long-exposure interval of the integration period, a short-exposure switch gate configured to direct charge generated during the short-exposure interval to the short-exposure storage node, a long-exposure switch gate configured to direct charge generated during the long-exposure interval to the long-exposure storage node, a readout mechanism comprising one or more floating diffusion (FD) capacitors, and instructions executable to determine a long-exposure signal and a short-exposure signal, if the long-exposure signal is not saturated, read out the long-exposure signal as a pixel signal, and if the long-exposure signal is saturated, read out the short-exposure signal multiplied by a ratio of the long-exposure interval to the short-exposure interval as the pixel signal.

17. The time-of-flight camera of claim 16, wherein the one or more taps comprises a first tap and a second tap, and wherein the readout mechanism comprises a short-exposure FD capacitor configured to receive charge from a short-exposure storage node of the first tap and to receive charge from a short-exposure storage node of the second tap, and a long-exposure FD capacitor configured to receive charge from a long-exposure storage node of the first tap and a long exposure storage node of the second tap.

18. The time-of-flight camera of claim 16, wherein the readout mechanism comprises, for each tap, a long-exposure FD capacitor; and a short-exposure FD capacitor.

19. The time-of-flight camera of claim 16, wherein the readout mechanism comprises, for each tap, a shared FD capacitor configured to receive charge from the short-exposure storage node and from the long-exposure storage node.

20. The time-of-flight camera of claim 19, further comprising a controller configured to selectively readout charge from the short-exposure storage node and charge from the long-exposure storage node in sequence in a high dynamic range mode, and readout a sum of the charge from the short-exposure storage node and the charge from the long-exposure storage node in a non-high dynamic range mode.

* * * * *